United States Patent
Tomiie et al.

(10) Patent No.: US 6,911,691 B2
(45) Date of Patent: *Jun. 28, 2005

(54) NONVOLATILE SEMICONDUCTOR MEMORY DEVICE

(75) Inventors: Hideto Tomiie, Kanagawa (JP); Toshio Terano, Kanagawa (JP); Toshio Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 10/343,393

(22) PCT Filed: May 31, 2002

(86) PCT No.: PCT/JP02/05360

§ 371 (c)(1),
(2), (4) Date: Jul. 23, 2003

(87) PCT Pub. No.: WO02/099893

PCT Pub. Date: Dec. 12, 2002

(65) Prior Publication Data

US 2004/0026733 A1 Feb. 12, 2004

(51) Int. Cl.[7] ............................................. H01L 29/792
(52) U.S. Cl. ...................... 257/324; 257/314; 257/315
(58) Field of Search .................................. 257/314–324

(56) References Cited

U.S. PATENT DOCUMENTS

| | | | |
|---|---|---|---|
| 5,274,255 A | * 12/1993 | de la Houssaye | 257/270 |
| 5,729,035 A | * 3/1998 | Anma | 257/324 |
| 5,838,041 A | * 11/1998 | Sakagami et al. | 257/324 |
| 5,969,383 A | 10/1999 | Chang | |
| 6,335,554 B1 | * 1/2002 | Yoshikawa | 257/316 |
| 6,721,205 B2 | * 4/2004 | Kobayashi et al. | 365/185.26 |

FOREIGN PATENT DOCUMENTS

JP 11-74389 3/1999

OTHER PUBLICATIONS

Ando et al, "Electronic Properties of two–dimensional systems", Review of Modern Physics, vol. 54, No. 2, Apr. 1982, pp. 437–672, especially p. 440 (for reasons of both relevance and economy only pp. 437–440 are included).*

(Continued)

*Primary Examiner*—Nathan J. Flynn
*Assistant Examiner*—Johannes Mondt
(74) *Attorney, Agent, or Firm*—Sonnenschein, Nath & Rosenthal LLP

(57) ABSTRACT

To propose a new channel structure suitable for high efficiency source side injection, and provide a non-volatile semiconductor memory device and a charge injection method using the same. The non-volatile memory device includes a first conductivity type semiconductor substrate (SUB), a first conductivity type inversion layer-forming region (CH1), second conductivity type accumulation layer-forming regions (ACLa, ACL2b), second conductivity type regions (S/D1, S/D2), an insulating film (GD0) and a first conductive layer (CL) formed on the inversion layer-forming region (CH1). A charge accumulation film (GD) and a second conductive layer (WL) are stacked on an upper surface and side surface of the first conductive layer (CL), an exposure surface of the inversion layer-forming region (CH1), and an upper surface of the accumulation layer-forming regions (ACLa, ACLb) and the second conductivity type regions (S/D1, S/D2). The second conductive layer (WL) is connected to a word line and second conductivity type regions (S/D1, S/D2) are connected to bit lines (Bla, BLb).

20 Claims, 20 Drawing Sheets

OTHER PUBLICATIONS

Y. Hayashi, et al., *Twin MONOS Cell with Dual Control Gates*, 2000 Symposium on VLSI Technology Digest of TEchnical Papers, 2000, pp. 122–123.

K–T Chang, et al., *A New SONOS Memory Using Source–Side Injection for Programming*, IEEE Electron Device Letters, vol. 19, No. 7, Jul. 1998, pp. 253–255.

Y. Ma, et al., *A Dual–bit Split–Gate EEPROM (DSG) Cell in Contactless Array for Single–Vcc High Density Flash Memories*, International Electron Devices Meeting, 1994, pp. 57–60.

K. Naruke, et al., *A New Flash–Erase EEPROM Cell With a Sidewall Select–Gate on Its Source Side*, International Electron Devices Meeting, 1989, pp. 603–606.

M.H. White, et al., *On the Go with SONOS*, IEEE Circuits & Devices, Jul. 2000, pp. 22–31.

S. Ogura, et al., *Low Voltage, Low Current, High Speed Program Step Split Gate with Ballistic Direct Injection for EEPROM/Flash*, International Electron Devices Meeting 1998, pp. 987–990.

\* cited by examiner

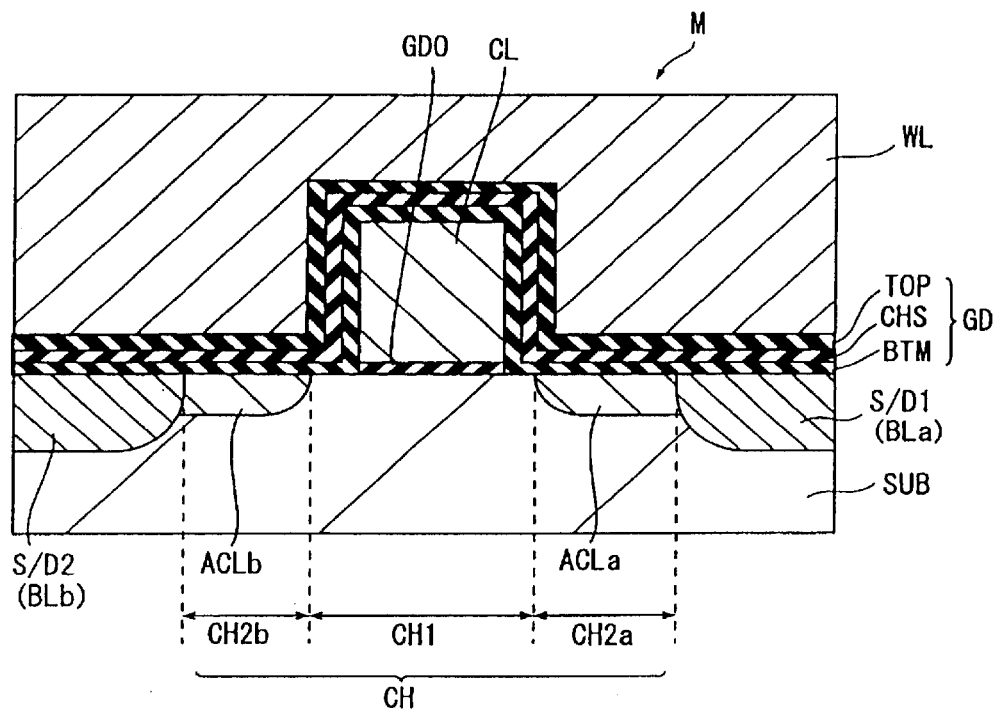
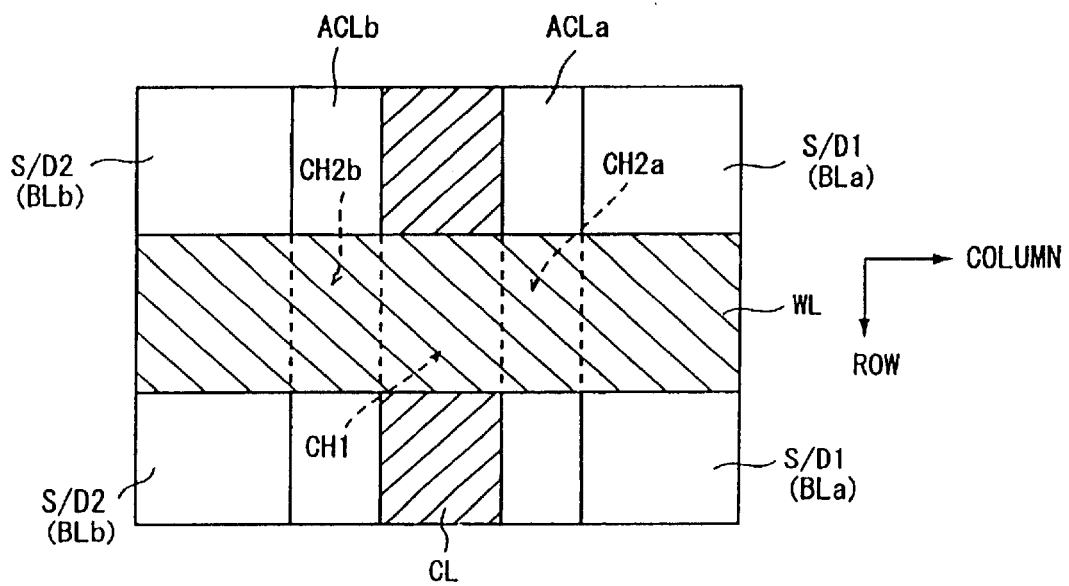

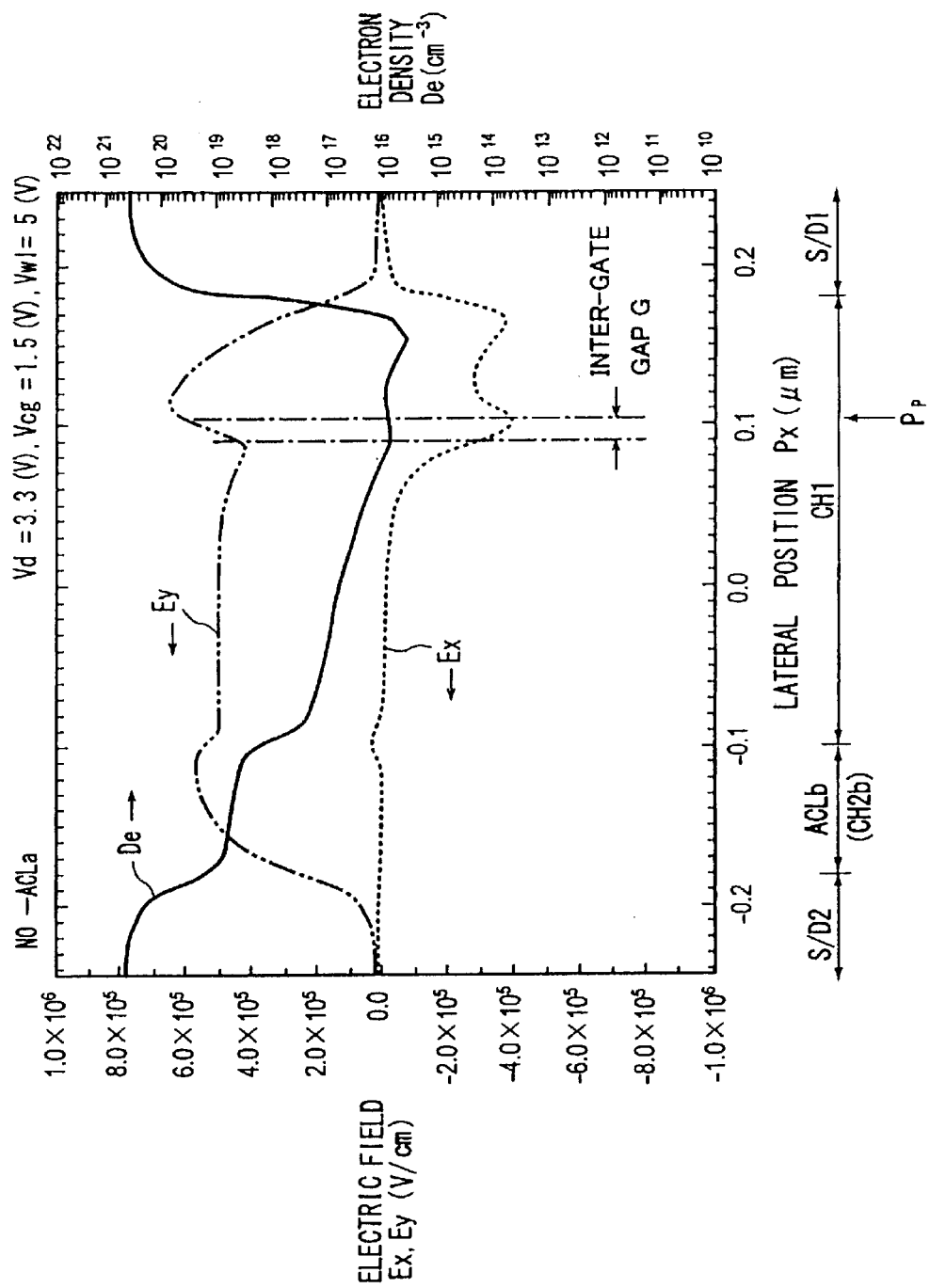

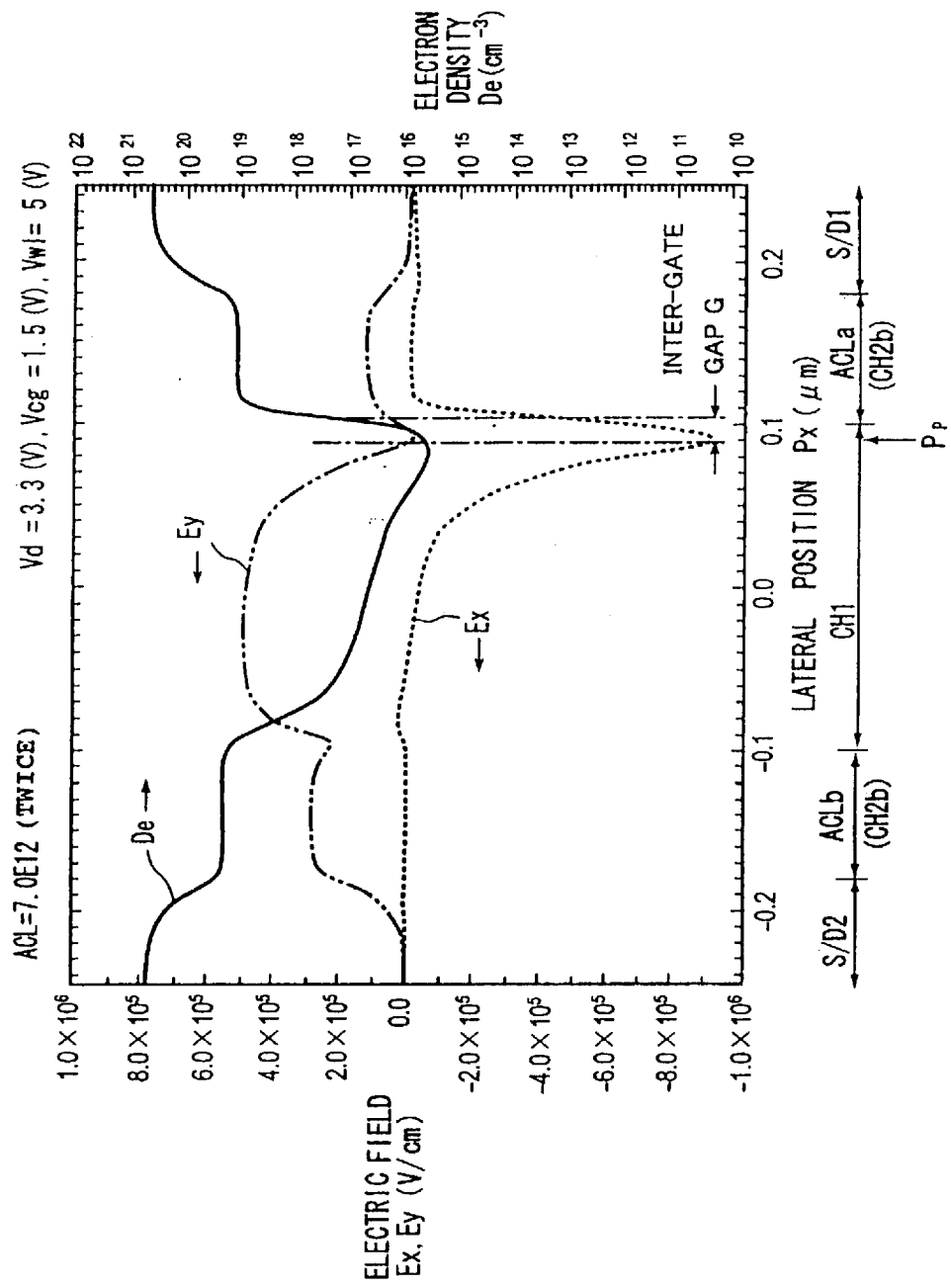

| MODE | Vsub | Vs | Vd | Vcg | Vmg |
|---|---|---|---|---|---|
| 1-1 | 0 | 0 | 7~8 | 3~5 | 0 |
| 1-2 | OPEN | 0 | 7~8 | 3~5 | 0 |
| 2 | 0 | OPEN | 8~9 | 0 | 0 |

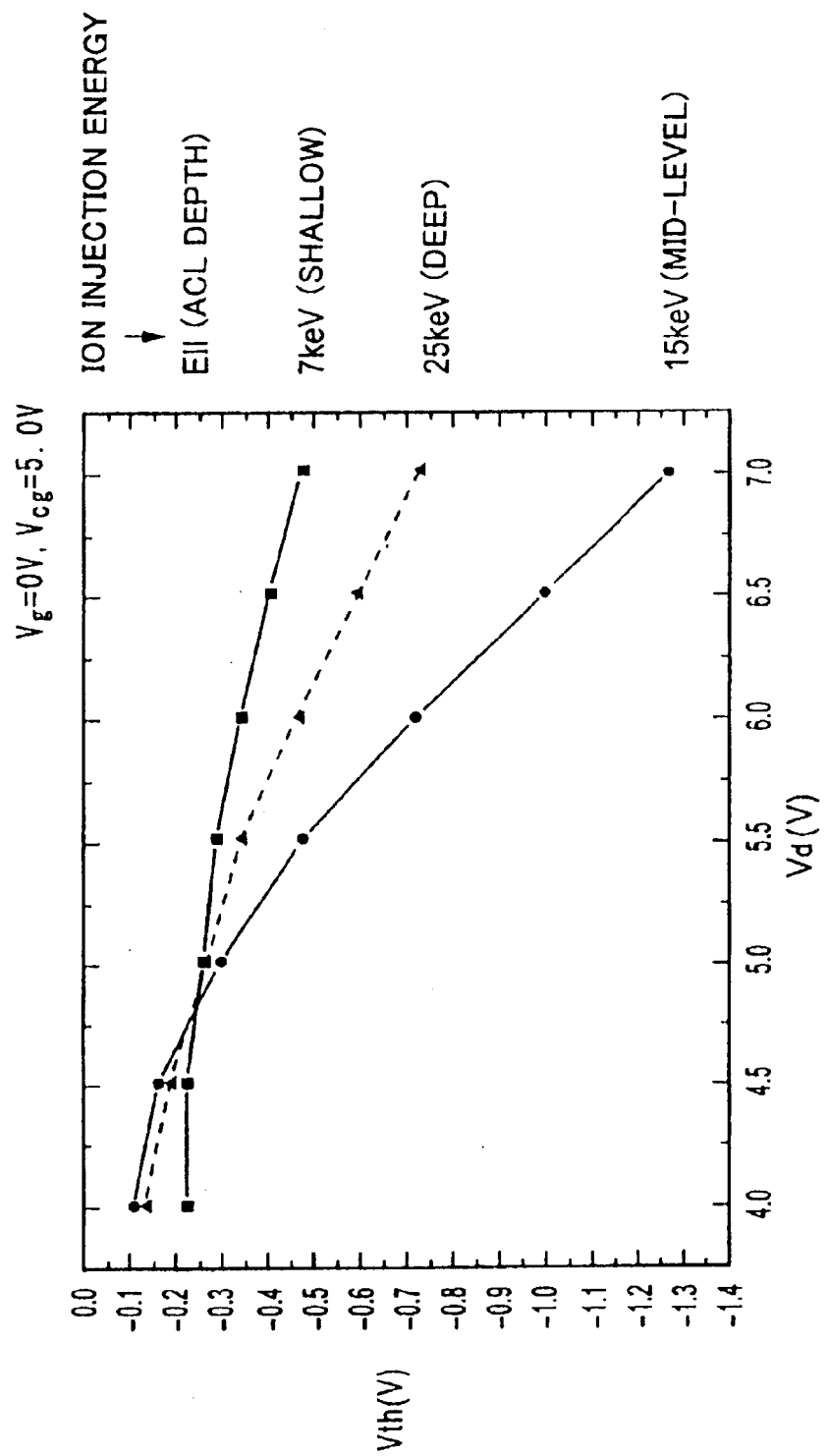

NONVOLATILE SEMICONDUCTOR MEMORY DEVICE

BACKGROUND OF THE INVENTION

The present invention relates to a non-volatile semiconductor memory device having an impurity arrangement structure and suitable for, for example, high efficiency source side injection and high-speed erasure.

As flush EEPROMs, there are known a FG (Floating Gate) type EEPROM wherein a charge accumulation means is comprised of a single conductive layer, a MONOS (Metal-Oxide-Nitride-Oxide-Semiconductor) type EEPROM and a MNOS (Metal-Nitride-Oxide-Nitride-Oxide) type EEPROM wherein charge accumulation means are made planarly discreted.

In the MONOS type memory element, for example, an ONO (Oxide-Nitride-Oxide) film and a gate electrode are stacked on a semiconductor substrate forming a transistor channel, and source and drain impurity regions having an inversion (a reverse) conductivity type to that of the channel are formed in the substrate surface region at both sides of the stacked pattern thereof.

Then, a charge is injected into a dielectric film (ONO film) having a charge holding faculty from the substrate side to perform writing. When erasing, the held charge is extracted to the substrate side or a charge having an inversion (a reverse) polarity for canceling the held charge is injected into the above dielectric film.

As the charge injection, in addition to utilizing a tunnel phenomenon of a charge in the dielectric film, there is known a method wherein a charge is energetically excited to a level which the charge exceeds an insulation barrier of an oxide film of the lowermost layer of the ONO film, such as the so-called CHE (Channel-Hot-Electron) injection.

As one type of the CHE injection method, a source side injection method is known.

To realize the source side injection method, an electrode for controlling a drain side channel and an electrode for controlling a source side channel must be separately provided. The reason for this is to render the drain side channel into a strong inversion (reverse) state and the source side channel into a weak inversion (reverse) state at the time of charge injection. At this time, high electric field occurs in the vicinity of the boundary of both channels thereof, a charge supplied from the source side is excited by this high electric field and injected from the source side to the charge accumulation means of the electrode for controlling the drain side channel. The injection efficiency is improved approximately one digit (10 times) more than a normal CHE injection.

Progress is being made on low voltage operation due to the demands of reducing consumption power and miniaturization of size of elements.

In the above CHE injection, however, in the case of for example the MONOS type memory transistor, it is known the charge injection efficiency, that is, the ratio of a current $I_G$ flowing towards a gate and a current $I_D$ flowing towards a drain deteriorates.

Further, it is notified that the charge injection efficiency of the FG type EEPROM is higher than that of the MONOS type EEPROM, however, that efficiency is insufficient. Employing the source side injection method further improves the charge injection efficiency, however, there has been encountered a limit in improving the charge injection efficiency of the current source side injection method.

SUMMARY OF THE INVENTION

An object of the present invention is to propose a new channel structure suitable for high efficiency source side injection and high-speed data erasure and provide a nonvolatile semiconductor memory device using the same.

A non-volatile semiconductor memory device according to a first aspect of the present invention for achieving the above object, includes: a first conductivity type semiconductor substrate (SUB); a first conductivity type inversion layer-forming region (CH1) defined in a surface region of the semiconductor substrate (SUB), a channel being formed by an inversion layer therein; second conductivity type accumulation layer-forming regions (ACLa, ACL2b) formed at least at one side of the inversion layer-forming region (CH1) in the surface region of the semiconductor substrate (SUB), channels being formed by accumulation layers therein; a channel forming region (CH) including the inversion layer-forming region (CH1) and the accumulation layer-forming regions (ACLa, ACLb); a first second conductivity type region (S/D1) formed at one side of the channel forming region (CH) in the surface region of the semiconductor substrate (SUB); a second conductivity type region (S/D2) formed at other side of the channel forming region (CH) in the surface region of the semiconductor substrate (SUB); an insulating film (GD0) formed on the inversion layer-forming region (CH1); a first conductive layer (CL) formed on the insulating film (GD0); a charge accumulation film (GD) having a charge accumulation faculty formed on an upper surface of the first conductive layer (CL), a side surface of a stacked portion of the insulating film (GD0) and the first conductive layer (CL), an exposure surface of the inversion layer-forming region (CH1), an upper surface of the accumulation layer-forming regions (ACLa, ACLb), and an upper surface of the first and second second conductivity type regions (S/D1, S/D2); and a second conductive layer (WL) formed on the charge accumulation film (GD); the second conductive layer (WL) being connected to a word line, and the first and second second conductivity type regions (S/D1, S/D2) being connected to bit lines (Bla, BLb).

A non-volatile semiconductor memory device according to a second aspect of the present invention for achieving the above object, includes: a first conductivity type semiconductor substrate (SUB); a first conductivity type inversion layer-forming region (CH1) defined in the surface region of the semiconductor substrate (SUB), a channel being formed by an inversion layer therein; second conductivity type accumulation layer-forming regions (ACLa, ACL2b) formed at least at one side of the inversion layer-forming region (CH1) in the surface region of the semiconductor substrate (SUB), channels being formed by accumulation layers therein; a channel forming region (CH) including the inversion layer-forming region (CH1) and the accumulation layer-forming regions (ACLa, ACLb); a first second conductivity type region (S/D1) formed at one side of the channel forming region (CH) in the surface region of the semiconductor substrate (SUB); a second second conductivity type region (S/D1) formed at other side of the channel forming region (CH) in the surface region of the semiconductor substrate (SUB); an insulating film (GD0) formed on the inversion layer-forming region (CH1); a first conductive layer (WG) formed on the insulating film (GD0); a charge accumulation film (GD) having a charge accumulation faculty formed on a side surface of a stacked portion of the first conductive layer (WG) and the insulating film (GD0), an exposure surface of the inversion layer-forming region (CH1), an upper surface of the accumulation layer-forming regions (ACLa, ACLb), and an upper surface of the first and second second conductivity type regions (S/D1, S/D2); and second conductive layers (CLa, CLb) formed on the charge accumulation film (GD) at a location above the accumulation layer-forming regions (ACLa, ACLb), the first conductive layer (WG) being connected to a word line, and the first and second second conductivity type regions (S/D1, S/D2) being connected to bit lines (Bla, BLb).

BRIEF DESCRIPTION OF THE DRAWINGS

FIG. 2A is a schematic sectional view taken in the direction along a word line of the memory cell shown in FIG. 1, and FIG. 2B is a plane view thereof.

FIG. 4 is a graph showing results of a device simulation in which a relationship of a horizontal direction position, an electron concentration and electric field strength was examined for a case where an accumulation layer-forming region of a drain side was omitted in the assumption of a memory cell of a structure without an accumulation layer-forming region.

FIG. 5 is a graph showing results of a device simulation in which a horizontal direction position and an electron density and electric field strength was examined for a case where a semiconductor directly under a memory gate has an inverse (a reverse) polarity to a semiconductor directly under a control gate in the assumption of the memory cell according to the first embodiment of the present invention.

FIG. 21 is a graph showing a drain voltage dependency of a threshold in which a relationship between a size of the ion injection energy and erasure speed was examined at the time of forming the accumulation layer-forming region in the second embodiment.

DETAILED DESCRIPTION OF THE PRESENTLY PREFERRED EMBODIMENTS

First Embodiment

Figure 1:
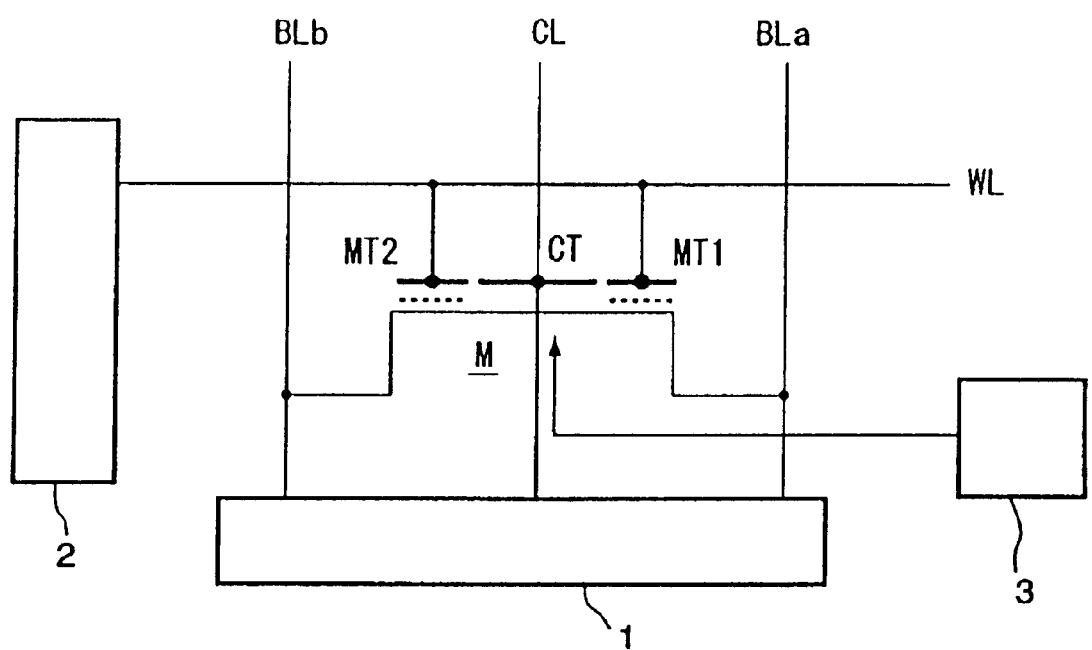
FIG. 1 is a view of an equivalent circuit showing the configuration of a non-volatile memory cell according to a first embodiment of the present invention.

FIG. 1 is a view of an equivalent circuit of a non-volatile memory cell as a first embodiment of a non-volatile semiconductor memory device of the present invention.

A memory cell M has a three-transistor configuration comprised of a first memory transistor MT1, a control transistor CT, and a second memory transistor MT2, connected in series between 2 lines of bit lines Bla, BLb.

In the memory cell M shown in FIG. 1, gates of the two memory transistors MT1, MT2 are controlled by a word line WL, while a gate of the control transistor CT is controlled by a control line CL.

An operation voltage is controlled at the time of writing, erasing and reading data, and a column operation controlling means 1 for controlling the bit lines BLa, BLb and the control line CL, a row operation controlling means 2 for controlling the word line WL, and a substrate voltage controlling means 3 for controlling a voltage applied to the substrate are provided as operation controlling means supplied to the memory cell.

FIG. 2A is a schematic sectional view taken in the direction along a word line of the memory cell shown in FIG. 1, and FIG. 2B is a plane view thereof.

In the memory cell shown in FIG. 2A, reference symbol SUB denotes a base substance (such as a P-type semiconductor substrate, a P-well, and a P-type SOI layer, hereinafter referred to as "substrate") for forming a semiconductor element and is comprised of a semiconductor material such as silicon. In the surface region of the substrate SUB, a first N-type region (first source/drain region S/D1) and a second N-type region (second source/drain region S/D2) formed having N-type impurities doped at a high concentration are formed apart from each other. The source/drain regions S/D1 and S/D2, as shown in FIG. 2, are arranged parallel to each other along in the row direction (ROW). A substrate surface region between the source/drain regions S/D1, S/D2 functions as a channel-forming region CH wherein channels of the memory transistors MT1, MT2 and the control transistor CH are formed at the time of operation. The channel-forming region CH is comprised of a central channel-forming region CH1 located approximately at the center and two side portion channel-forming regions CH2a, CH2b located between the central channel-forming region CH1 and the two source/drain regions S/D1, S/D2.

The central channel-forming region CH1 has a P-type conductivity, that is, the conductivity type of the surface region of the substrate SUB. From the fact that a channel is formed in an inversion layer, the central channel-forming region CH1 will hereinafter be referred to as "inversion layer-forming region".

Contrary to this, the side portion channel-forming regions CH2a, CH2b are comprised of N-type impurity regions ACLa, ACLb having a concentration (density) lower than the source/drain regions S/D1, S/D2. From the fact that a channel is formed by a large number of carriers accumulating in the surface of the N-type impurity regions ACLa, ACLb, they will hereinafter be referred to as "accumulation layer-forming regions". The accumulation layer-forming regions ACLa, ACLb are arranged at the bottom of the word line WL parallel to each other along the source/drain S/D1, S/D2.

A dielectric film (gate insulating film) GD0 comprised of silicon dioxide having a thickness of about, for example, 1 nm to 10 nm is formed on the inversion layer-forming region CH1. The gate insulating film GD0 is a single layer and carrier traps inside the film is comparatively small, so does not have a charge holding faculty.

A control gate CL comprised of for example polycrystalline silicon or amorphous silicon doped with impurities is stacked on the gate insulating film GD0 in the same width thereof. The control gate CL, as shown in FIG. 2B, has a width narrower than the width of the inversion layer-forming region CH1 and the spaced distance between the accumulation layer-forming regions ACLa, ACLb is arranged along in the row direction parallel with the source/drain regions S/D1, S/D2. Though there are no limitations placed on the width of the control gate CL (length of the gate), if made ultrafine to for example 50 nm or less, carriers inside the channel will travel semi-ballistically in the channel, and so is preferable. Depending on the condition of an electric field, however, if the gate length is made very fine as such, when a carrier supplied from the source moves inside the channel, a scattering angle by impurity particle is subjected to a small low-angle scattering but not subjected to a high-angle scattering like largely bending an orbit, and so the carrier travels ballistically in the channel.

A first potential barrier film (bottom potential barrier film BTM) is formed covering an upper surface and side surface of the control gate CL stacked on the gate insulating film GD0, a surface of the inversion layer-forming region CH1 wherein the gate insulating film GD0 is not formed, surfaces of the accumulation layer-forming regions ACLa, ACLb and surfaces of the source/drain regions S/D1, S/D2. A charge trap film CHS is formed on the bottom potential barrier film BTM, and a second potential barrier film (top potential barrier film TOP) is further formed on the charge trap film CHS. The bottom potential barrier film BTM, the charge trap film CHS, and the top potential barrier film TOP comprises a charge accumulation film GD having a charge accmumulation faculty.

For example, a silicon dioxide film formed by thermal oxidation method, a silicon dioxide film subjected to nitriding, etc. is used as the bottom potential barrier film BTM. The film thickness of the bottom potential barrier film BTM is, for example, about 2.5 nm to 6.0 nm.

The charge trap film CHS is a film serving mainly for capturing and accumulating charges, and is comprised of a silicon nitride film of for example about 3.0 nm to 20 nm thick. The charge trap film CHS is fabricated by for example low pressure CVD (LP-CVD) and contains a large number of charge trapping levels therein.

In the vicinity of an interface with the charge trap film CHS, it is necessary to form deep charge trapping levels at a high density. For this purpose, the top potential barrier film TOP is formed by for example thermal oxidation of a formed charge trap film. The top potential barrier film TOP may be a HTO (High-Temperature-chemical-vapor-deposited-Oxide) film. When the top potential barrier film TOP is formed by CVD, deep charge trapping levels are formed by heat treatment. The film thickness of the top potential barrier film TOP needs to be at least 3.0 nm, preferably 3.5 nm or more for effectively blocking injection of holes from the gate electrode (word line WL) and preventing a decrease of the rewritable number of data.

The word line WL doubling as a gate electrode of a memory transistor intersecting with the control gate CL is formed on the top potential barrier film TOP. The word line WL is comprised of for example polycrystalline silicon or amorphous silicon doped with impurities.

In FIG. 2A, the control transistor CT shown in FIG. 1 is formed by the inversion layer-forming region CH1, the accumulation layer-forming regions ACLa, ACLb, the gate insulating film GD0, and the control gate CL. The memory transistor MT1 shown in FIG. 1 is formed by the accumulation layer-forming region ACLa, the inversion layer-forming region CH1, the source/drain region S/D1, and the charge accumulation films (GD, BTM, CHS, TOP). The memory transistor MT2 shown in FIG. 1 is formed by the accumulation layer-forming region ACLb, the source/drain region S/D2, the inversion layer-forming region CH1, and the charge accumulation films (GD, BTM, CHS, TOP).

In the memory cell M, the control transistor CT operates secondarily in order to improve the charge injection efficiency at the writing or erasing time of the memory transistors MT1, MT2. Further, due to the existence of the control transistor CT, regions for injecting charges are limited. That is, a region for injecting charges in the memory transistor MT1 (hereinafter, referred to as storage 1) is limited by a portion of the charge accumulation film GD on top of the accumulation layer-forming region ACLb, and a region for injecting charges in the memory transistor MT2 (hereinafter, referred to as storage 2) is limited by a portion of the charge accumulation film GD on top of the accumulation layer-forming region ACLa. The single-layered gate insulating film GD0 located between the storage 1 and the storage 2 does not have a charge accumulation faculty, so it cannot contribute to data storage. Furthermore, due to the existence of the control transistor CT, the charges injected into the memory transistors MT1, MT2 located on both sides thereof do not interfere among each other, and therefore two bit storing can be surely performed to the two memory transistors MT1, MT2.

Next, an operation of the memory cell M will be explained.

Figure 3A:
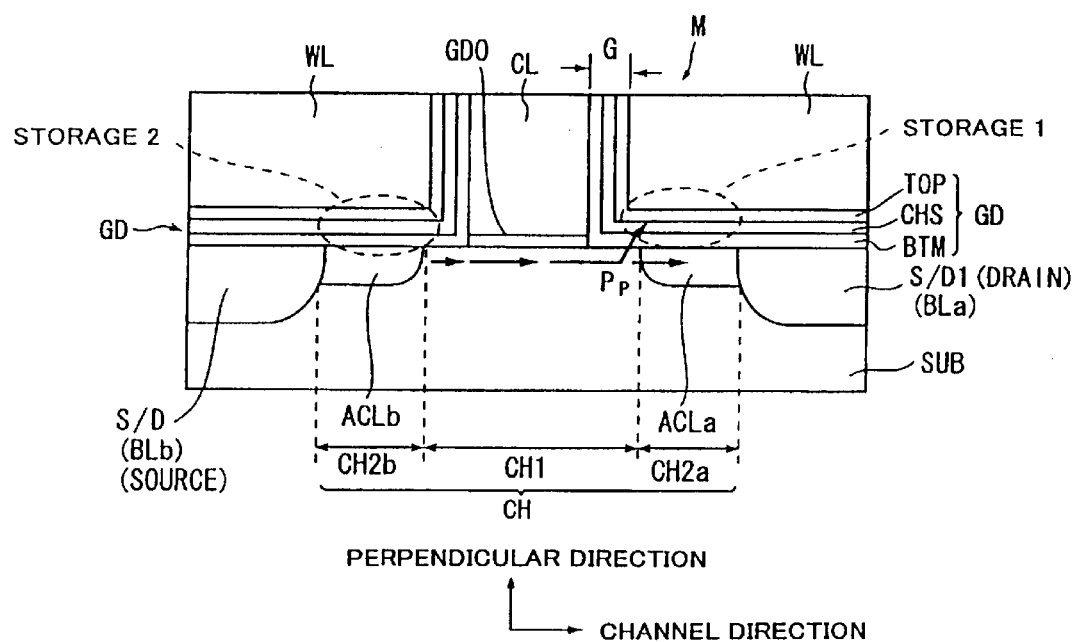
FIG. 3A is an explanatory view of an operation when injecting electrons into a storage using the source side charge injection method.

FIG. 3A is an explanatory view of an operation when injecting electrons into the storage 1 using the source side charge injection method.

At the time of writing, the column operation controlling means 1 supplies a reference voltage Vs to the second source/drain region S/D2 serving as a source and a voltage Vd, for example, 5.0 V, to the first source/drain region S/D1 serving as a drain. Further, the column operation controlling means supplies a predetermined positive voltage Vcg, for example, 1.0 V, to the control gate (control line CL), while the row operation controlling means 2 supplies a predetermined positive voltage Vmg, for example, 7.0 V, to the word line WL. Note that the control line CL illustrated in FIG. 1 corresponds to the control gate.

Under these conditions, an inversion layer is induced in the inversion layer-forming region CH1, whereby in the vicinity of the surfaces of the accumulation layer-forming regions ACLa, ACLb at both sides thereof, an accumulation layer is formed. Electrons from the accumulation layer formed by the accumulation layer-forming region ACLb of the source side are supplied to the inversion layer induced in the inversion layer-forming region CH1, the supplied electrons are accelerated in the inversion layer of the inversion layer-forming region CH1, and a portion thereof turns into high energy electrons (hot electron) exceeding an energy barrier $\Phi_{SiO2}$ of the silicon oxide film comprising the bottom potential barrier film BTM at a drain side end portion vicinity $P_P$ of the inversion layer-forming region CH1. A portion of the hot electrons are injected into the storage 1 at a certain probability.

Figure 3B:
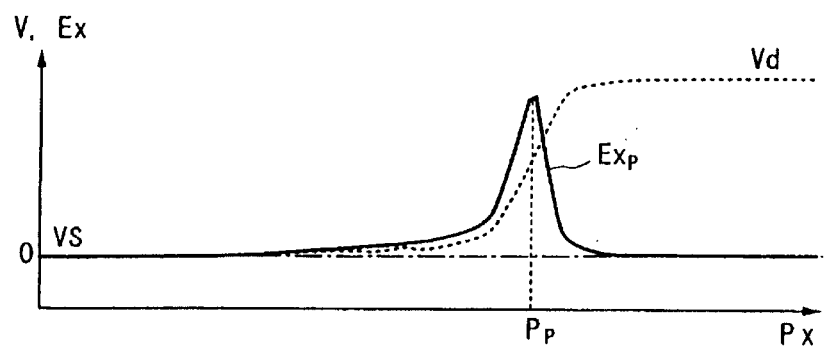
FIG. 3B is an explanatory view showing a relationship among a horizontal position of a channel direction, a channel potential, and a channel electric field of the horizontal direction at this point.

A relationship among a position Px in a channel direction, a channel potential V, and a channel electric field Ex in a horizontal direction at this point is shown in FIG. 3B.

A potential difference between the drain voltage Vd and the source voltage (reference voltage) Vs is mainly applied to the drain side end portion vicinity $P_P$ of the inversion layer-forming region CH1 positioned between the control gate CL and the accumulation layer-forming region ACLa of the drain side. As a result, a high electric field in the channel direction occurs in the drain side end portion vicinity $P_P$ of the inversion layer-forming region shown by a curve line $Ex_p$.

The high electric field of the channel direction rapidly accelerates the electrons in the inversion layer, and by making the electrons into high energy electrons, electrons are injected into the storage 1. For the purpose of improving the injection efficiency of electrons, it is good to situate a peak of the electric field $Ex_p$ of the channel direction in a region where an electric field of the channel and perpendicular direction is as high as possible. This electric field control is achieved by changing a value of the voltage supplied to the control gate CL and the word line WL, respectively.

In the present embodiment, an accumulation layer is formed using the accumulation layer-forming region ACLa, and a resistance thereof is reduced. Due to this, a channel resistance at the drain side end portion vicinity $P_P$ of the inversion layer-forming region CH1 between the control line CL and the accumulation layer-forming region ACLa becomes relatively high. Therefore, the potential difference between the drain voltage Vd and the source voltage Vs converges locally at the drain side end portion vicinity $P_P$ of the inversion layer-forming region CH1 and is supplied. Utilizing this, an electric field of the channel direction is raised at the region $P_P$ near a source side end portion of the storage 1, and due to a potential difference between the word line WL and the drain S/D1, an electric field of the region $P_P$ facing the channel direction and the perpendicular direction running straight is raised.

In the source side charge injection method, the activation energy required for electrons to exceed the potential barrier of the bottom potential barrier film BTM is obtained from the electric field of the channel direction in the region $P_P$, near the source side end portion of the storage 1. Further, an electric field of the channel direction and perpendicular direction necessary for injection can be obtained from the same region $P_P$. Therefore, the charge injection efficiency is improved more than that of the usual CHE injection.

Particularly, in the case where the accumulation layer-forming regions ACLa, ACLb are provided as in the present embodiment, by optimizing the concentration of the N-type impurity of the inversion layer-forming region CH1 forming the inversion layer and the depth and concentration (density) of the P-type impurity of the accumulation layer-forming region ACLa, a degree of freedom of the range of the voltage applied to the control line CL and the word line WL is increased, whereby an advantage of easily improving the charge injection efficiency is attained.

Contrarily, when performing write to the storage 2, by switching the condition of the impress voltage between the two source/drain regions S/D1, S/D2, electrons are efficiently injected into the storage 2 by the same operation as above.

By doing as such, two bits information can be independently written in the memory cell M comprising the two memory transistors MT1, MT2 illustrated in FIG. 1 and FIG. 2.

Figure 6:
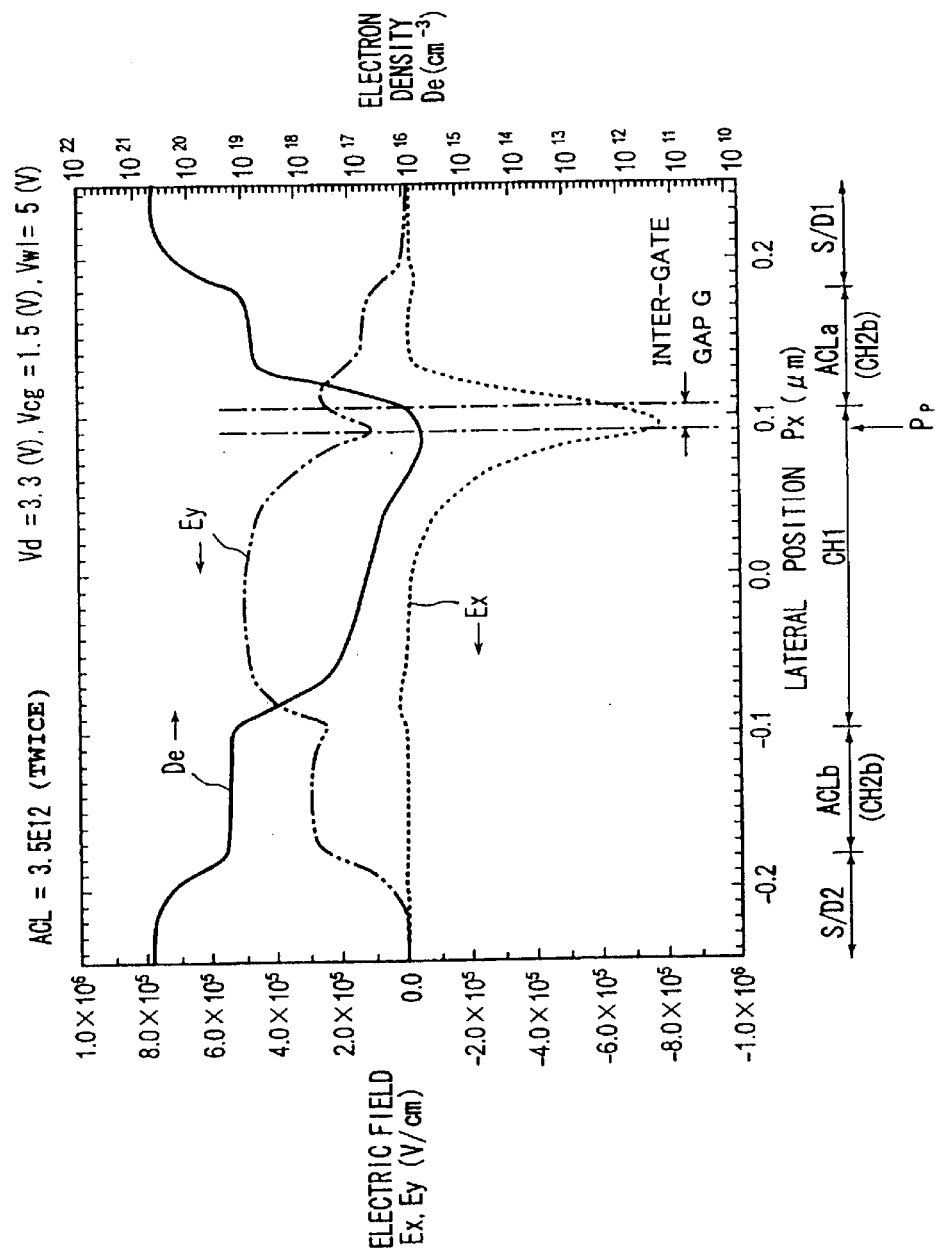
FIG. 6 is a graph showing results of a device simulation in which a horizontal direction position and an electron density and electric field strength was examined for a case where N-type semiconductors directly under a memory gate and directly under a control gate have inverse polarities and a lower concentration than that of FIG. 5 in the assumption of the memory cell according to the first embodiment of the present invention.

FIG. 4 to FIG. 6 are graphs showing results of a device simulation in which a distribution of electron density and electric field strength in the channel direction were examined in response to whether there is an accumulation layer-forming region ACL or not.

In the device simulation, a control gate length was set to 0.18 μm, a memory gate length to 0.09 μm, a thickness of the charge accumulation film GD having charge accumulation faculty to 15 nm, and a thickness of the insulating film GD0 underneath the control gate to 10 nm, and each of the voltages 5 V was supplied to the word line WL, 1.5 V to the control gate CL and 3.3 V to the drain (source/drain region S/D1).

The abscissa in each of the graphs denotes a position Px in the channel horizontal direction, and is symmetrical with respect to a center of the cell as the starting point 0.0. The left side ordinate in each of the graphs denotes electric field intensities Ex, Ey. In the drawings, a curve line shown by a dotted line having a large negative peak denotes a strength of the electric field Ex of the channel horizontal direction, while a curve line shown by a two-dotted broken line having a positive peak denotes a strength of the electric field Ey of the channel perpendicular direction. The right side ordinate axis in each of the graphs denotes an electron density De.

FIG. 4 shows a case where the accumulation layer-forming region ACLa of the drain side is omitted.

In this case, since a P-type is used for the substrate SUB, channel-forming regions CH directly under the control gate CL and the word line WL are comprised of a P-type semiconductor.

The electron density De denoted by a solid line in the graph is the highest in the source/drain regions S/D, about $5\times10^{20}/cm^3$, the next highest in the accumulation layer-forming region ACLb of the source S/D2 side, about $8\times10^{18}/cm^3$, and changes smoothly so that in the inversion layer-forming region CH1 therebetween, it decreases as it nears the drain side.

A direction of the electric field headed for the source S/D2 from the drain S/D1 is the heading direction of the electric field, however, since the electrons accelerate in a reverse direction from the direction of the electric field, the channel direction accelerated electric field Ex of electrons have a negative polarity at the drain side having strong electric field strength. Since electrons are injected in the direction headed for the charge accumulation film GD and the gate electrode (word line WL) from the channel surface, the injection of electrons is assisted more in places where the strength of the perpendicular direction electric field Ey is stronger. Here, $0.09\ \mu m \leq Px \leq 0.15\ \mu m$ is an inter-gate gap G between the word line WL portion functioning as a memory gate of the memory transistor at the drain S/D1 side and the control gate CL.

FIG. 5 and FIG. 6 are graphs showing simulation results on the memory cell according to the present embodiment wherein the conductivity type of the semiconductor directly under the word line WL portion functioning as the memory gate and the conductivity type of the semiconductor directly under the control gate CL are inversed. Directly under the control gate CL is a P-type semiconductor whereas directly under the memory gate is an N-type semiconductor due to the presence of the accumulation layer-forming regions ACLa, ACLb. In the conditions for ion injection when producing the calculation model of FIG. 5, a dose amount was set to $7\times10^{12}\ cm^{-2}$ and acceleration energy to 7 keV. These conditions correspond to the case of performing ion injection twice. Further, in the ion injection conditions of FIG. 6, dose amount was set to $3.5\times10^{12}\ cm^{-2}$ and acceleration energy to 7 keV so that the N-type impurity concentration (density) of the semiconductor directly under the memory gate is lower than that of FIG. 5. These conditions correspond to the case of performing ion injection twice.

First, attention is directed to the electric field Ex of the channel horizontal direction. In the graphs of FIG. 5 and FIG. 6, a negative peak of the electric field Ex of the horizontal direction changes precipitously to about $-8.0\times10^5$ V/cm or so. Comparing these graphs, the electric field Ex in the graph of FIG. 4 does not drop precipitously, clearly showing that there is no concentration of the electric field Ex. As a result, the electric field strength is low. Due to this, in a model corresponding to the conventional memory cell structure of FIG. 4, there is a lack of electric field Ex for energetically exciting the electrons, so the probability of generating hot electrons is lower than in the cases of FIG. 5 and FIG. 6.

Regarding the electron density De, since directly under the memory gate is a P-type semiconductor in the structure of FIG. 4, when compared with FIG. 5 and FIG. 6, the electron density is somewhat lower. With respect to this, in the graphs of FIG. 5 and FIG. 6, the channel horizontal direction electric field Ex drastically declines and the electron density De near places where the electron acceleration strength is the greatest, is approximately $1\times10^{16}\ cm^{-3}$.

Directing attention to the electric field Ey of the channel perpendicular direction, in FIG. 4, given that directly under the memory gate is a P-type semiconductor and the memory gate is a positive bias, a depletion layer expanse to the substrate surface (interface of the charge accumulation film GD and the substrate SUB) and the electric field strength Ey of the channel perpendicular direction is strong. On the other hand, in FIG. 5 and FIG. 6, the electric field Ey strength of the channel perpendicular direction is lower than that of FIG. 4.

To efficiently inject electrons into the charge accumulation film GD, it is necessary to generate more hot electrons by a sufficient amount of electric field Ex of the channel horizontal direction to induce the generated hot electrons to the dielectric film side by the electric field Ey of the channel perpendicular direction high to a certain extent. At this point, if the electron density De is not high in places where the concentration of the electric field Ex of the channel horizontal direction is the strongest, even if the probability of generating hot electrons is high, the amount of electrons as the amount for injection becomes less.

In FIG. 4, changes of the electric field Ex of the channel horizontal direction is small so the electric field strength is low, and because the generating probability of hot electrons is low, charge injection efficiency is low.

In FIG. 4 to FIG. 6, changes of the electric field Ex of the channel horizontal direction is the largest in FIG. 5, however, the electric field Ey of the channel perpendicular direction is a low of about $1\times10^5$ (V/cm), and therefore the injection efficiency of hot electrons is considered not very high.

In FIG. 6, the concentration of the electric field Ex of the channel horizontal direction is sufficient, and the electric field Ey of the channel perpendicular direction is $5\times10^5$ to $6\times10^5$ (V/cm), also reaching a sufficient level, whereby the highest injection efficiency can be expected.

The prototype memory cell was produced on the basis of the calculation results of the device simulation, and the writing characteristics of the memory cell were actually evaluated. The evaluation results are shown in FIG. 7 to FIG. 9.

Figure 7:
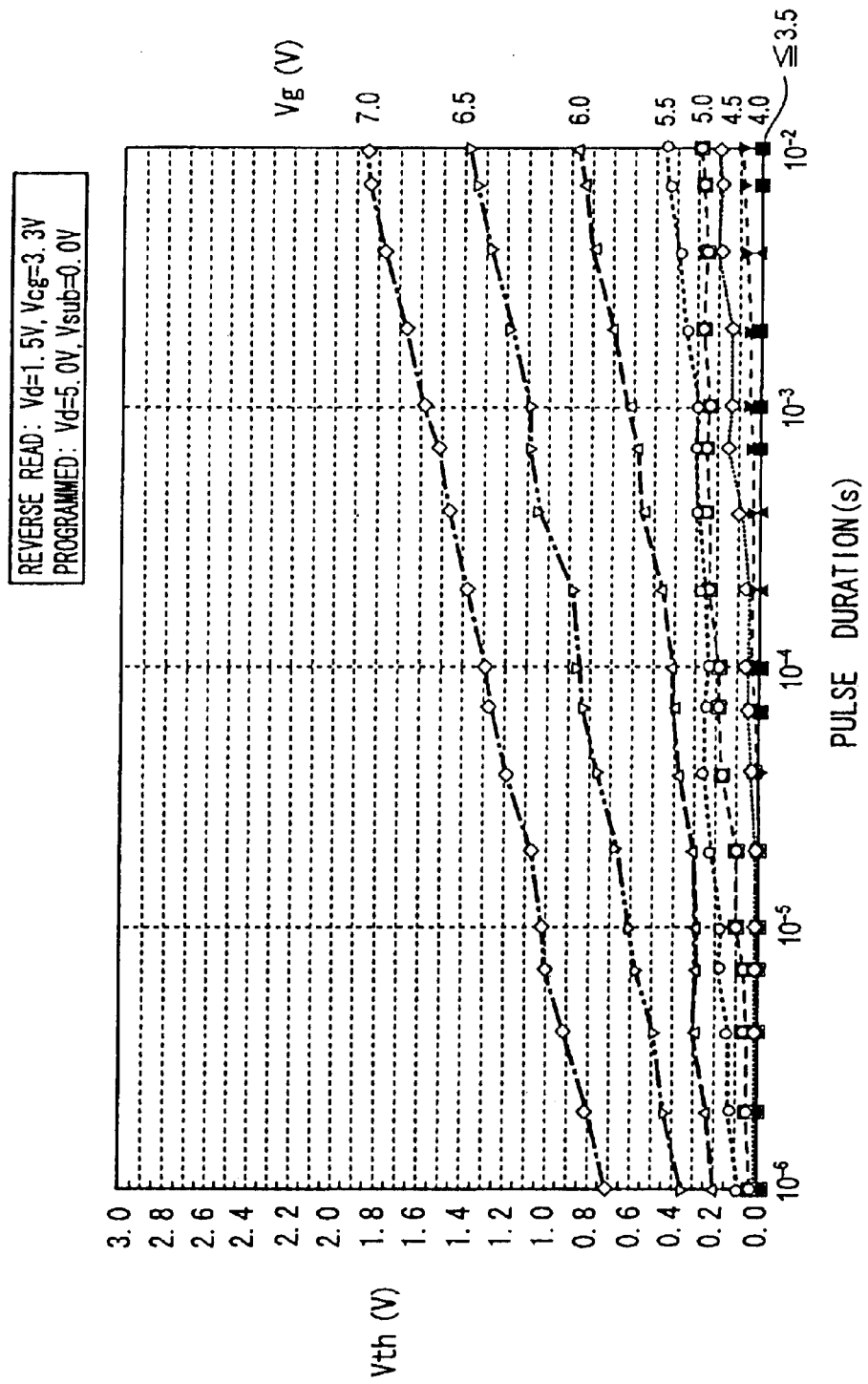
FIG. 7 is a graph showing evaluation results of data writing characteristics of a prototype memory cell produced under the conditions corresponding to the model shown in FIG. 4.

FIG. 7 is a graph of a conventional type memory cell, that is, results of measurements of the writing characteristics of a memory cell wherein a P-type semiconductor is directly under both the memory gate (word line) and control gate. This structure corresponds to the model of FIG. 4 in the foregoing device simulation.

Figure 8:
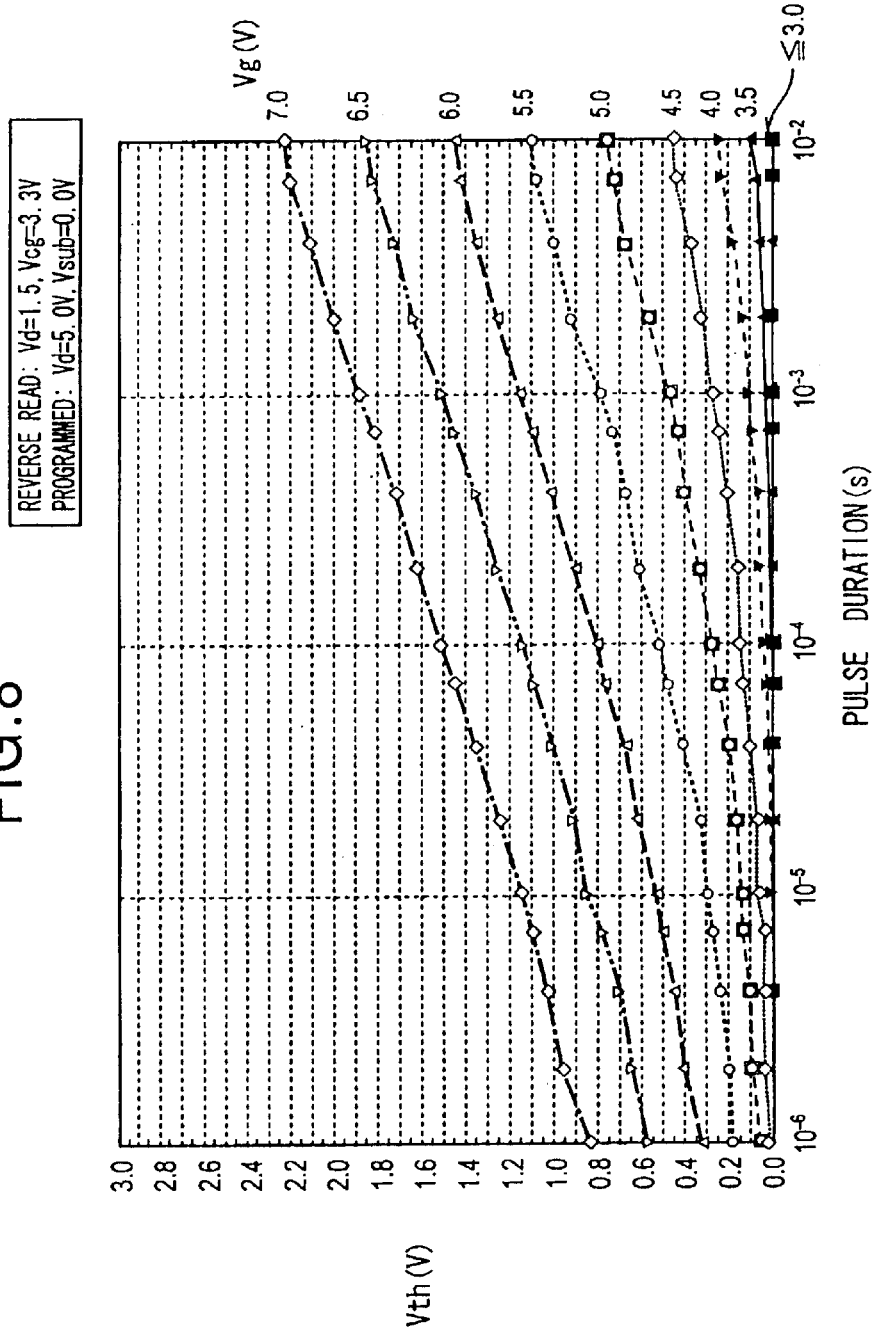
FIG. 8 is a graph showing evaluation results of writing characteristics of a prototype memory cell produced under the conditions corresponding to the model shown in FIG. 5.
Figure 9:
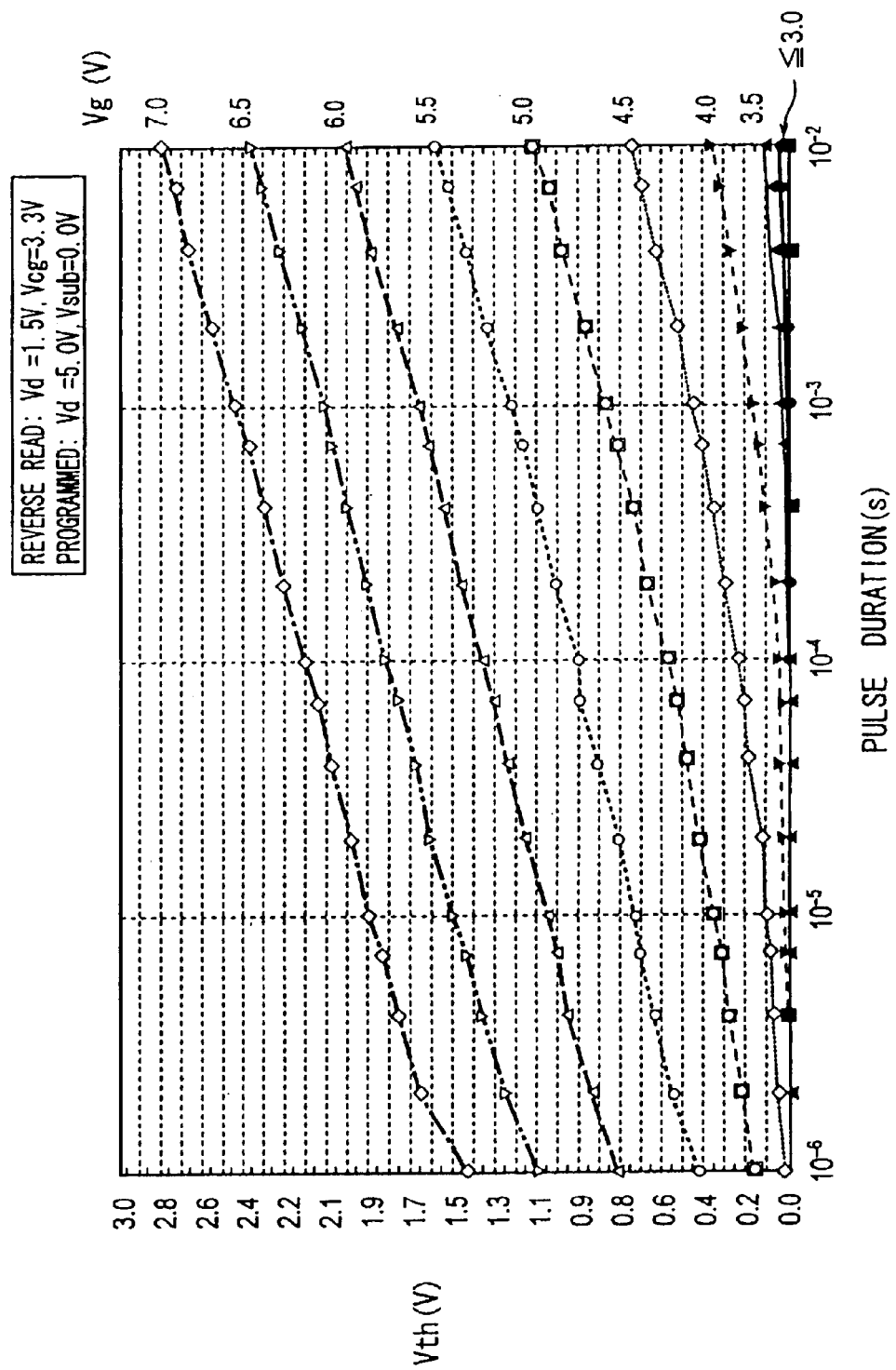
FIG. 9 is a graph showing evaluation results of data writing characteristics of a prototype memory cell produced under the conditions corresponding to the model shown in FIG. 6.

FIG. 8 and FIG. 9 are graphs of the memory cell of the present embodiment, that is, results of measurements of the writing characteristics of a memory cell having directly under the memory gate an N-type accumulation layer-forming region having an inverse (a reverse) polarity to the semiconductor directly under the control gate. In the memory cell used in the measurement of FIG. 9, similar to the model of FIG. 5 in the foregoing device simulation, ion injection was performed twice under a dose amount of $7\times10^{12}\ cm^{-2}$ and acceleration energy of 7 keV to form the accumulation layer-forming regions ACLa, ACLb. In the memory cell used in the measurement of FIG. 9, the impurity concentration of the accumulation layer-forming regions ACLa, ACLb directly under the memory gate is slightly lower than the case of FIG. 8 and corresponds to the model of FIG. 6. In other words, the accumulation layer-forming regions ACLa, ACLb were formed by performing ion injection twice under a dose amount of $3.5\times10^{12}\ cm^{-2}$ and acceleration energy of 7 keV.

Plotted in the graphs of FIG. 7 to FIG. 11 is a threshold voltage when an application duration of a writing pulse to be applied to the memory gate was changed in the range from $1\times10^{-6}$ s (1 $\mu$s) to $1\times10^{-2}$ s (10 ms). Further, in each of the graphs of FIG. 7 to FIG. 11, a voltage value of a pulse for writing to be applied to the memory gate was caused to change from 2.5 V to 7.0 V with 0.5 V notch as a parameter, and each of the threshold voltages Vth of the voltage value is connected by a line and shown as a curve line denoting the transition thereof.

Shown in FIG. 7 to FIG. 11 is a cell having a large variation in the threshold voltage Vth in a region where a voltage value Vg of the writing pulse is low and the application duration of the pulse is short, enabling high charge injection efficiency and high-speed operation.

In the voltage Vg of the curve line 7 V in FIG. 7, the application duration of the writing pulse was a shortest 1 μs and a threshold voltage Vth of 0.7 V was detected, and further, in order to obtain a 1.5 V threahold voltage Vth, the writing pulse voltage Vg must be made 7 V.

In the voltage Vg of the curve line 7 V in FIG. 8, the application duration of the writing pulse was 1 μs and a threshold voltage Vth of 0.8 V was detected. In a writing operation where Vg is equal to 7 V and a pulse application duration is 1 ms, a threshold voltage Vth of 1.9 V has been detected. This shows that the charge injection efficiency is higher than the example of FIG. 7 due to providing the accumulation layer-forming regions ACLa.

In the voltage Vg of the curve line 7 V in FIG. 9, the application duration of the writing pulse was 1 μs and a large threshold voltage Vth of 1.4 V was detected. In a writing operation where Vg is equal to 7 V and a pulse application duration is 1 ms, a threshold voltage Vth varies until 2.45 V. This result shows that if the impurity concentration of the accumulation layer-forming region ACLa is optimized, the charge injection efficiency becomes considerably high.

These measurement results conform to the calculations from the device simulations results illustrated in FIG. 4 to FIG. 6. It is shown that the memory cell comprising the accumulation layer-forming region ACLa illustrated in FIGS. 1 and 2 is more capable of higher charge injection efficiency and higher-speed and lower voltage operation than the memory cell without the accumulation layer-forming region ACLa. Further, to improve the charge injection efficiency as an aim to make a memory cell high-speed and low voltage, the impurity concentration of the accumulation layer-forming regions is reduced lower than the impurity concentration of the source/drain regions S/D1, S/D2, indicating that an optimized value exist in the concentration thereof.

In the erasure operation, the charge held in the charge accumulation film is extracted or a charge having an inverse polarity to that of the charge held in the charge accumulation film is injected.

In the case of extracting the held charges, there is a case of extracting the charges to the word line side through the top potential barrier film TOP and a case of extracting the charges to the substrate side through the bottom potential barrier film BTM. In either case, in order to generate electric field of the extracting direction, the operation voltage controlling means 1, 2, and 3 applies a voltage between the word line WL and the source/drain region S/D1 or S/D2 in FIG. 1 (and between the word line WL and the substrate SUB). Due to this, the held charges are extracted to the substrate side or the word line side by FN tunneling or the like. When the held charges are extracted from the charge accumulation film, the memory transistor changes to an erasure state.

Figure 10:
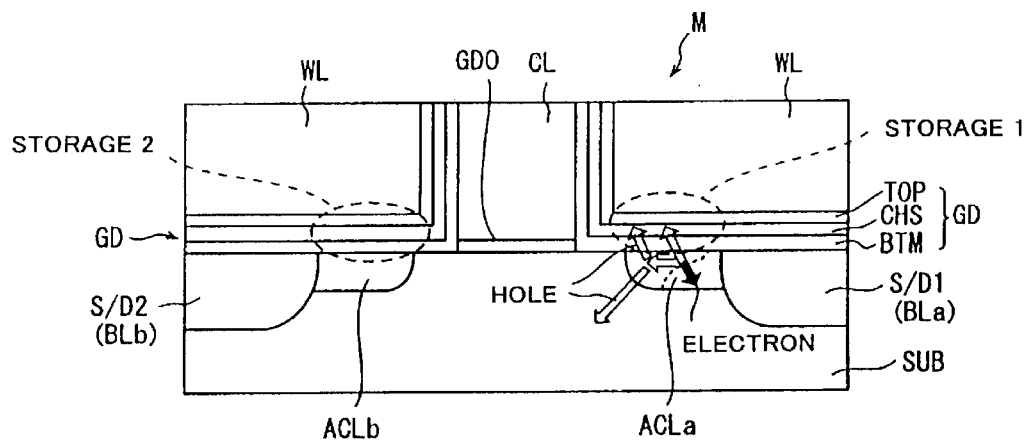
FIG. 10 is a view showing an operation of a case wherein a charge having an inverse polarity to that of a held charge is generated and injected by utilizing the inter-band tunneling to perform erasure in the memory cell of the first embodiment.

Contrarily, as illustrated in FIG. 10, in the case of performing erasing by injecting into the storage 1 charges having an inverse polarity to that of held charges, a negative voltage is applied to the word line WL portion serving as the memory gate of the storage 1 side while a positive voltage is applied to the source/drain region S/D1 of the storage 1 side. Under these conditions, an inversion layer is formed in the accumulation layer-forming region ACLa, and an avalanche breakdown occurs due to a precipitous curving of an energy band. In the course leading up to the breakdown, high energy electrons, occurrence of pairs of holes, and hot electrons are drawn to the positive voltage and absorbed into the accumulation layer-forming region ACLa or the source/drain region S/D1. A greater portion of the hot holes flows to the substrate SUB, however, a portion thereof is drawn to the an electric field by the memory gate and injected into the charge accumulation film GD (storage 1). Even in this erasure method, when there is a desire to inject the hot holes into the storage 2 of the opposite side, then similar electric field is caused to occur in the storage 2 side. The erasing of data in the storage 2 can be performed independently from the storage 1 and two bit erasure is also possible at the same time.

In the reading operation, the so-called inversion read is employed. In other words, the operation controlling means 1, 2 applies a drain voltage of about, for example, 1.5 to 3 V to between the two source/drain regions S/D1, S/D2 and a predetermined positive voltage to the control gate CL and the word line WL portion serving as the memory gate of the source side, respectively, so that the storage side holding the stored data intended for reading serves as a source while the other storage side serves as a drain. As a result, in response to whether there are charges in the source side storage intended for reading or not, or a difference in the amount of charges, a channel is rendered ON or OFF or a difference in the amount of current flow occurs, resulting in the emergence of a potential variation in the source/drain region of the drain side. Reading of this potential variation by an unillustrated sense amplifier enables logical discrimination of the storage data. Reading of the other storage can be similarly performed by switching the source and drain. Thus, two bit storage data can be read independently.

Figure 11A:
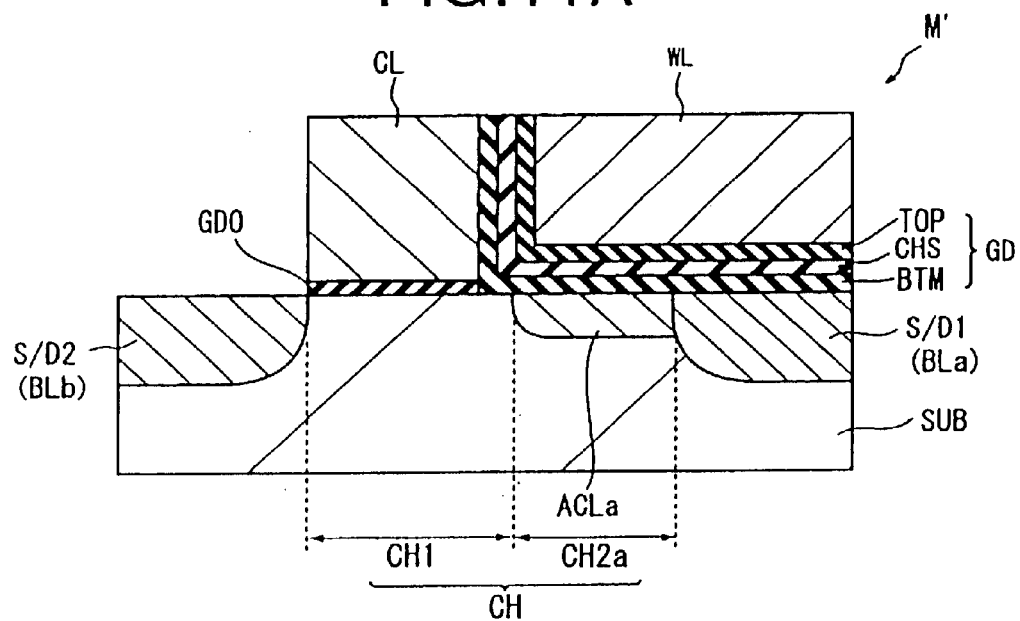
FIG. 11A is a schematic sectional view in the direction along a word line of a modified example of the memory cell shown in FIG. 2A.
Figure 11B:
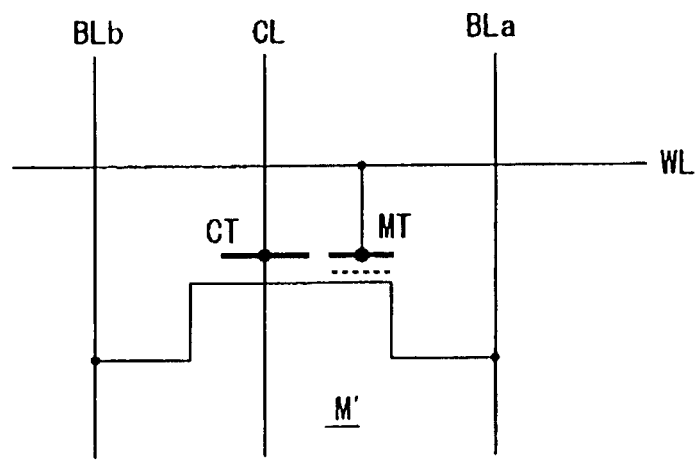
FIG. 11B is a view of an equivalent circuit thereof.

A sectional view of a word line direction of a memory cell as a modified example of the first embodiment is shown in FIG. 11A. FIG. 11B is a view of an equivalent circuit of the memory cell.

A memory cell M' is comprised of a two-transistor configuration wherein a memory transistor MT and the control transistor CT are connected in series between the two lines of bit lines BLa, BLb. The memory transistor MT, similar to the two memory transistors MT1, MT2 illustrated in FIG. 1, is controlled by the word line WL.

In the sectional view structure of the memory cell M', the accumulation layer-forming region ACLb is not formed therein as in the sectional view structure of the memory cell illustrated in FIG. 2A, but instead the source/drain region S/D2 is provided in the substrate region near an edge of the control gate (control line) CL and there is not formation of the charge accumulation film GD at the side surface of the control gate CL of the source/drain region S/D2 side. The accumulation layer-forming region ACLa of the source/drain region S/D1 side has the same impurity concentration and depth as the accumulation layer-forming region ACLa shown in FIG. 2A. The memory cell shown in FIG. 11A stores one bit data, however, the dimension of the memory cell is smaller than the dimension of the memory cell for two bit storage illustrated in FIG. 2A.

Second Embodiment

Figure 12:
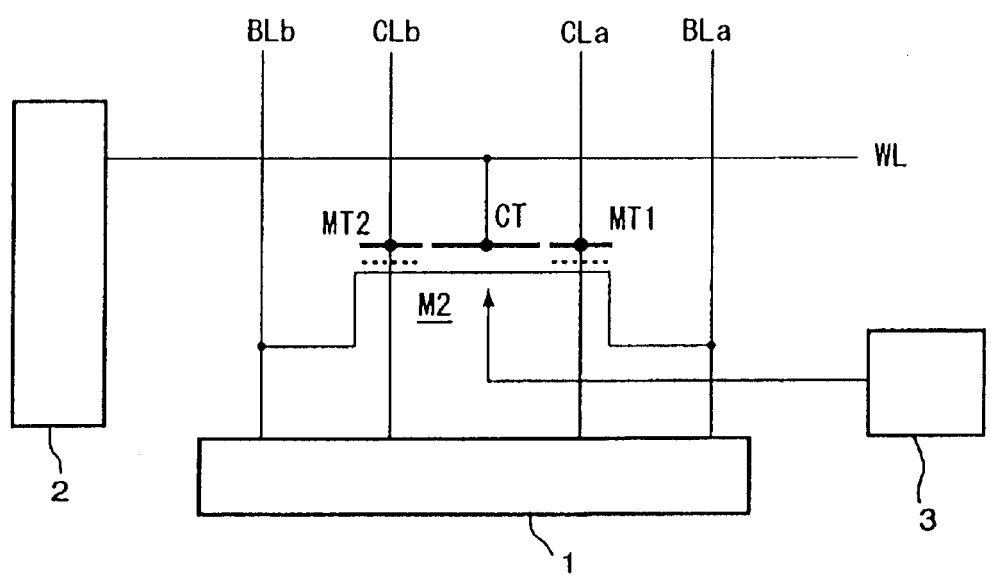
FIG. 12 is a view of an equivalent circuit showing the configuration of a non-volatile memory cell according to a second embodiment of the present invention.

FIG. 12 is a view of an equivalent circuit of a non-volatile memory cell as a second embodiment of the non-volatile semiconductor memory device of the present invention.

In a memory cell 2 shown in FIG. 12, a gate of a control transistor CT is controlled by a word line WL, a gate of the memory transistor MT1 is controlled by a first control line CLa, and a gate of a memory transistor MT2 is controlled by a second control line CLb.

An operation voltage is controlled at the time of writing, erasing and reading data, and a column operation controlling means 1 for controlling the bit lines BLa, BLb and control lines CLa, CLb, a row operation controlling means 2 for controlling the word line WL, and a substrate voltage controlling means 3 for controlling the application of a voltage to the substrate are provided as operation controlling means supplied to the memory cell 2.

Figure 13A:
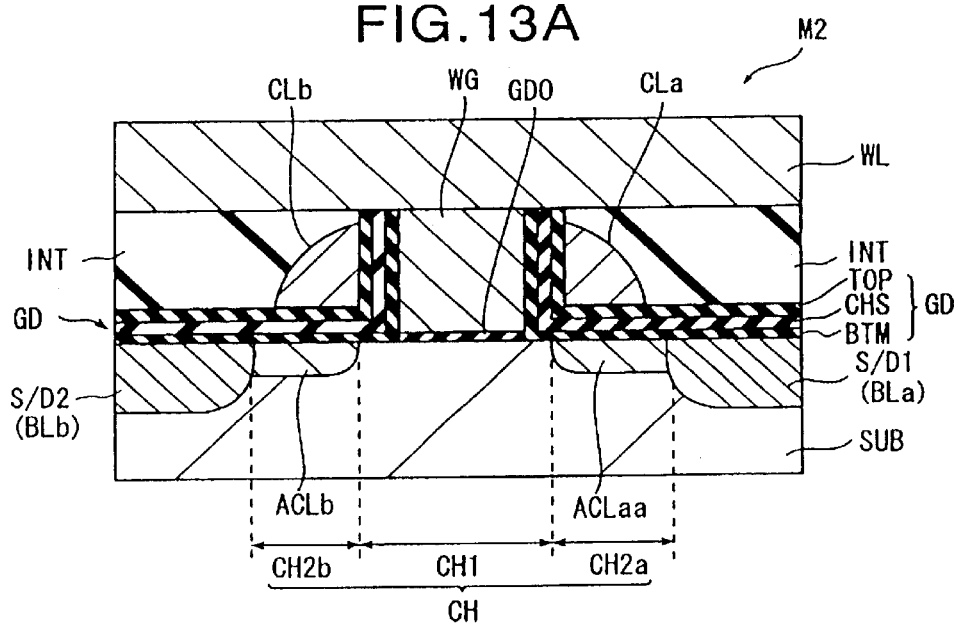
FIG. 13A is a schematic sectional view in the direction along a word line of the memory cell shown in FIG. 12.
Figure 13B:
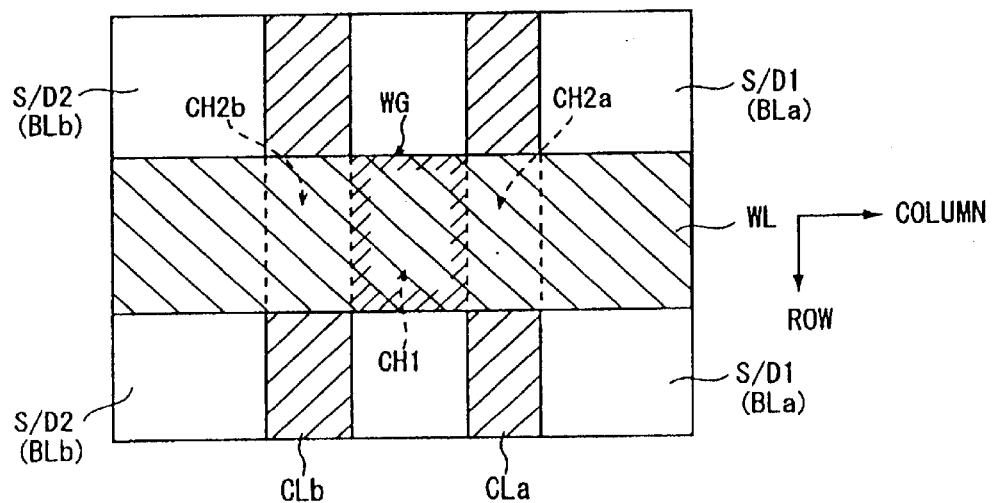
FIG. 13B is a plane view thereof.

FIG. 13A is a schematic sectional view in a direction along a word line of the memory cell shown in FIG. 12, and FIG. 13B is a plane view thereof.

In the memory cell, similar to the illustrations of FIGS. 2A and 2B, source/drain regions S/D1, S/D2, and accumulation layer-forming regions ACLa, ACLb are formed in a surface region of a substrate SUB. A surface region of the substrate SUB between the accumulation layer-forming regions ACLa, ACLb serves as an inversion layer-forming region CH1.

On the inversion layer-forming region CH1 is formed a gate insulating film GD0 having a width narrower than the width of the inversion layer-forming region CH1, and a word gate electrode WG is formed on the gate insulating film GD0. The word gate electrode WG, comprised of for example polycrystalline silicon or amorphous silicon doped with impurities, is formed having the same width as that of the word line WL and as an isolated pattern in every memory cell. In FIG. 13A, the inversion layer-forming region CH1, the accumulation layer-forming regions ACLa, ACLb, the gate insulating film GD0, and the word gate electrode WG forms the control transistor CT shown in FIG. 12.

A bottom potential barrier film BTM is formed covering the two side surfaces of the word gate electrode WG facing each other in the channel direction, a surface of the inversion layer-forming region CH1 where the gate insulating film GD0 is not formed, surfaces of the accumulation layer-forming regions ACLa, ACLb and surfaces of the source/drain regions S/D1, S/D2. A charge trap film CHS is formed on the bottom potential barrier film BTM, and a top potential barrier film TOP is further formed on the charge trap film CHS. The bottom potential barrier film BTM, the charge trap film CHS, and the top potential barrier film TOP comprises a charge accumulation film GD having a charge accumulation faculty.

The control lines CLa, CLb having for example a ¼ circular shape sectional surface is formed in the regions located above the accumulation layer-forming regions ACLa, ACLb on top of the top potential barrier film TOP of the side surfaces of the word gate electrode WL. The control lines CLa, CLb are comprised of polycrystalline silicon or amorphous silicon doped with impurities. The control lines CLa, CLb are embedded in an interlayer insulating layer INT and arranged parallelly in the row direction. In FIG. 12, the control lines CLa, CLb are gate electrodes of the memory transistors MT1 and MT2.

The word line WL electrically connected to the word gate electrode WG is formed on the interlayer insulating layer INT.

In the memory cell M, the control transistor CT operates secondarily in order to improve the charge injection efficiency at the writing or erasing time of the memory transistors MT1, MT2. Further, due to the existence of the control transistor CT, regions for injecting charges are limited. That is, a storage 1 for injecting charges in the memory transistor MT1 is limited by a portion of the charge accumulation film GD on top of the accumulation layer-forming region ACLb, and a storage 2 for injecting charges in the memory transistor MT2 is limited by a portion of the charge accumulation film GD on top of the accumulation layer-forming region ACLa. The single-layered gate insulating film GD0 located between the storage 1 and the storage 2 does not have a charge accumulation faculty, so it cannot contribute to data storage. Furthermore, due to the existence of the control transistor CT, the charges injected into the memory transistors MT1, MT2 located on both sides thereof do not interfere among each other, and therefore two bit storing can be surely performed to the two memory transistors MT1, MT2.

Figure 14A:
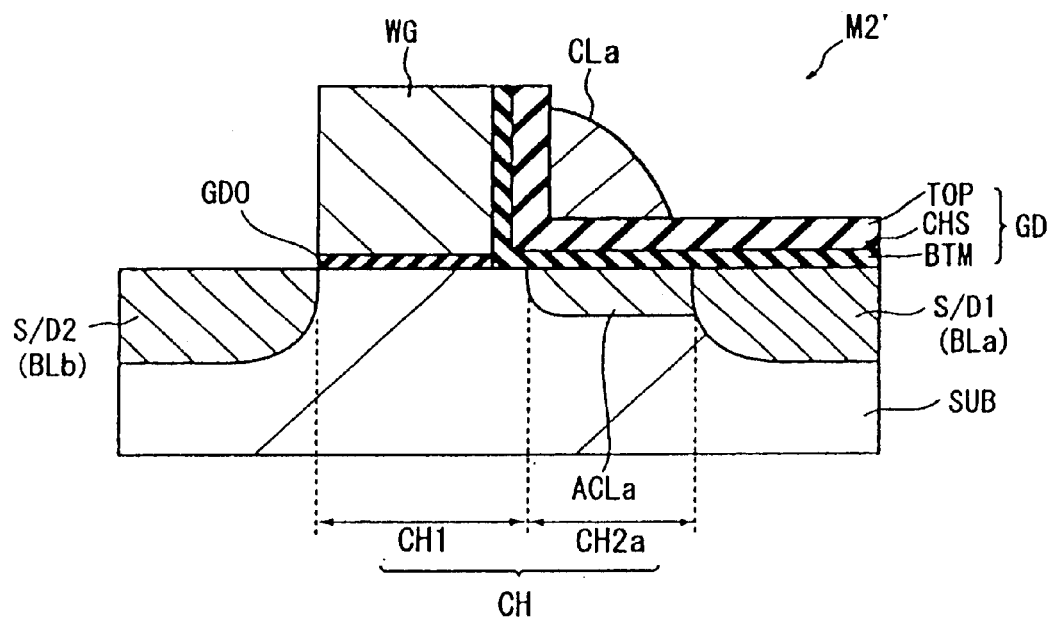
FIG. 14 is a schematic sectional view in the direction along a word line of a modified example of the memory cell shown in FIG. 13A.
FIG. 14B is a view of an equivalent circuit thereof.
Figure 14B:
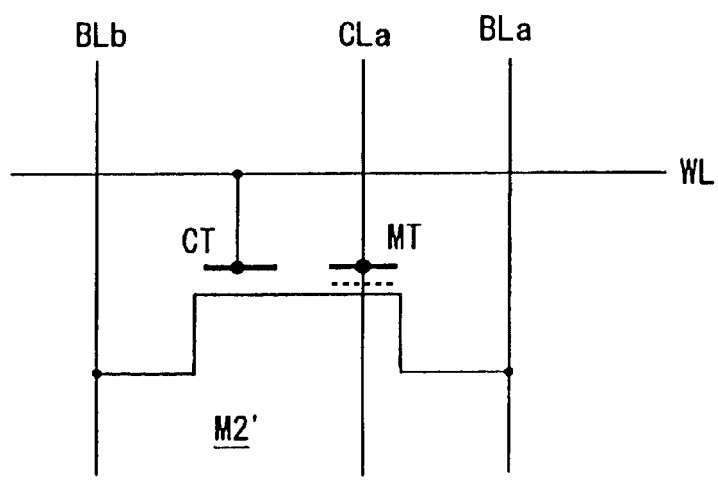

A sectional view of a word line direction of the memory cell as a modified example of the second embodiment is shown in FIG. 14A. FIG. 14B is a view of an equivalent circuit of the memory cell.

A memory cell M2' is comprised of a two-transistor configuration wherein the memory transistor MT and the control transistor CT are connected in series between the two lines of bit lines BLa, BLb. The memory transistor MT, similar to the memory transistors MT1 illustrated in FIG. 12, is controlled by the control line CLa.

In the sectional view structure of the memory cell M2', the accumulation layer-forming region ACLb is not formed therein as in the sectional view structure of the memory cell illustrated in FIG. 13A, but instead the source/drain region S/D2 is provided in the substrate region near an edge of the word gate electrode WG and there is no formation of the charge accumulation film GD at the side surface of the word gate electrode WG of the source/drain region S/D2 side. The accumulation layer-forming region ACLa of the source/drain region S/D1 side has the same impurity concentration and depth as the accumulation layer-forming region ACLa shown in FIG. 13A. The memory cell shown in FIG. 14A stores one bit data, however, the dimension of the memory cell is smaller than the dimension of the memory cell for two bit storage illustrated in FIG. 13A.

Third Embodiment

A third embodiment relates to a charge injection method for efficiently injecting holes at the time of erasing without using a negative voltage.

Figure 15:
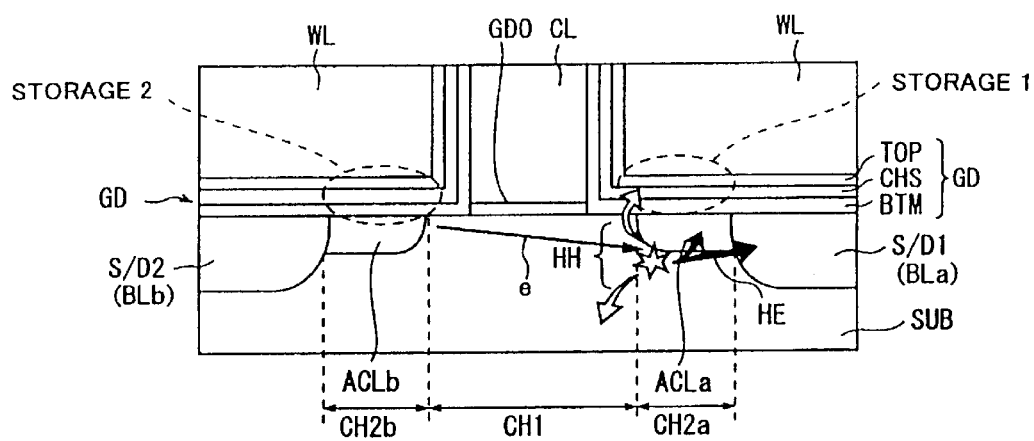
FIG. 15 is a view showing an operation of a case wherein a charge having an inverse polarity to that of a held charge is generated and injected by a secondary ionization colliding to perform erasure in the memory cell of the second embodiment.
Figures 16, 17:
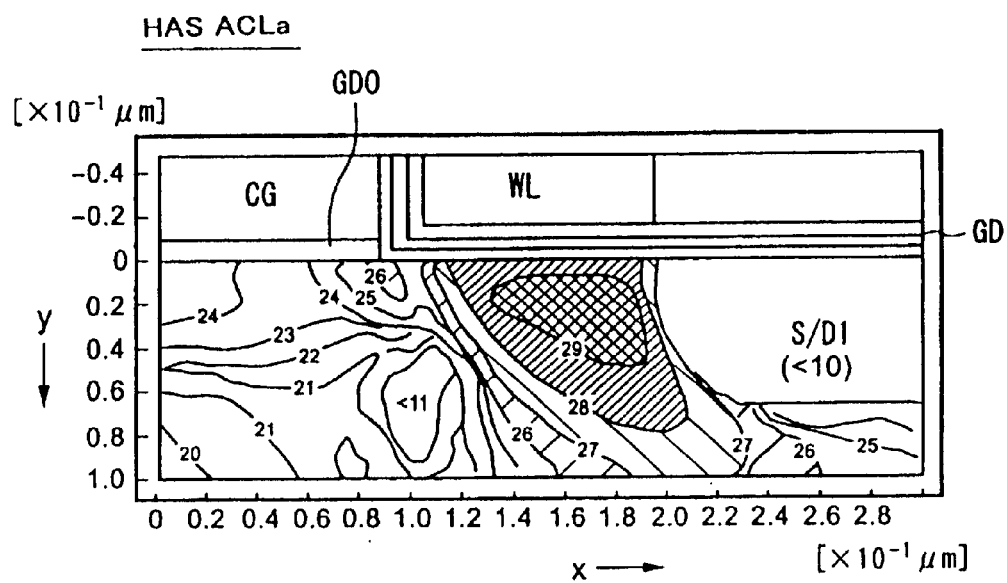
FIG. 16 is a chart showing bias application conditions in every data erasure mode of a memory cell in an operation of a memory cell of a third embodiment of the present invention.
FIG. 17 is a view of a high-energy charge distribution obtained from a simulation of an element structure having an accumulation layer-forming region.

FIG. 15 is a view showing an erasure operation. A structure similar to the structure illustrated in FIG. 3A is shown. FIG. 16 is a chart showing erasure bias conditions. As an erasure operation, two modes (mode 1-1, mode 1-2) utilizing ionization colliding and a mode 2 utilizing interband tunneling are shown.

First, the mode 1-1 will be explained.

In the erasure of the mode 1-1, the operation voltage controlling means 1, 2, and 3 renders a source voltage Vs to be applied to the source/drain region S/D2 serving as a source, a substrate voltage Vsub to be applied to the substrate (first conductivity type semiconductor) SUB, and an erasure gate voltage Vmg to be applied to the word line WL all into a reference potential Vss (for example, 0 V). Under this state, the column operation controlling means 1 applies a predetermined positive voltage (drain voltage Vd=7 to 8 V) to the source/drain region S/D1 serving as a drain, and a predetermined positive voltage Vcg=3 to 5 V to the control gate CL as a controlling gate voltage for forming a channel in the inversion layer-forming region CH1.

Under this bias condition, an electron e traveling in the formed channel from the left to the right direction of FIG. 15 is accelerated by an electric field in the lateral direction, and a portion thereof becomes hot electrons. However, different from the first embodiment, because the memory gate (word line) is not biased with a positive voltage, most of the electrons are not injected into the charge accumulation film GD but while being further accelerated, a portion of the electrons travels around to a region below the accumulation layer-forming region ACLa avoiding the highly resistant accumulation layer-forming region ACLa in a state without a accumulation film formed therein while the rest enters the accumulation layer-forming region ACLa. The high energy electrons that have entered a depletion layer directly under the accumulation layer-forming region ACLa or into the accumulation layer-forming region ACLs collide with silicon lattices or are subjected to dispersion, thereby generating a pair of high energy hole HH and electron HE. Between the high energy hole HH and electron HE, the hot electron HE is absorbed by the N-type source/drain region S/D1 or the accumulation layer-forming region ACLa, whereas the hot hole HH drifts to a center side of the channel forming region CH1, while a portion thereof heads for the word line WL portion above the source/drain region S/D1 along a recess of a potential at a boundary of the substrate SUB and the accumulation layer-forming region ACLa. The hot hole exceeds the potential barrier of the bottom film BTM and is captured by a carrier trap inside the charge trap film CHS. The capturing region of these charges (storage 1) is limited by a portion of the drain S/D1 side.

FIG. 7 is a view showing simulation results of an ionization colliding erasure of the mode 1-1. In this simulation, an energy distribution per unit volume in a given unit time is obtained by calculation under the conditions in which the source/drain region S/D2 serving as the source, the substrate SUB, and the word line WL portion serving as the memory gate are provided and a voltage of 7 V is applied to the source/drain region S/D1 serving as the drain and a voltage of 5 V to the control gate CL. FIG. 17 shows a cross-sectional view of a portion of a drain side of an element cut across a channel direction, and a vertical and lateral scale per unit thereof is 0.1 m. A numerical value in FIG. 17 is an exponent value expressing high energy charge density, for example, $1 \times 10^{26}/cm^3$ or greater of high energy charges exist in the inner side of the numerical value 26.

Figure 18:
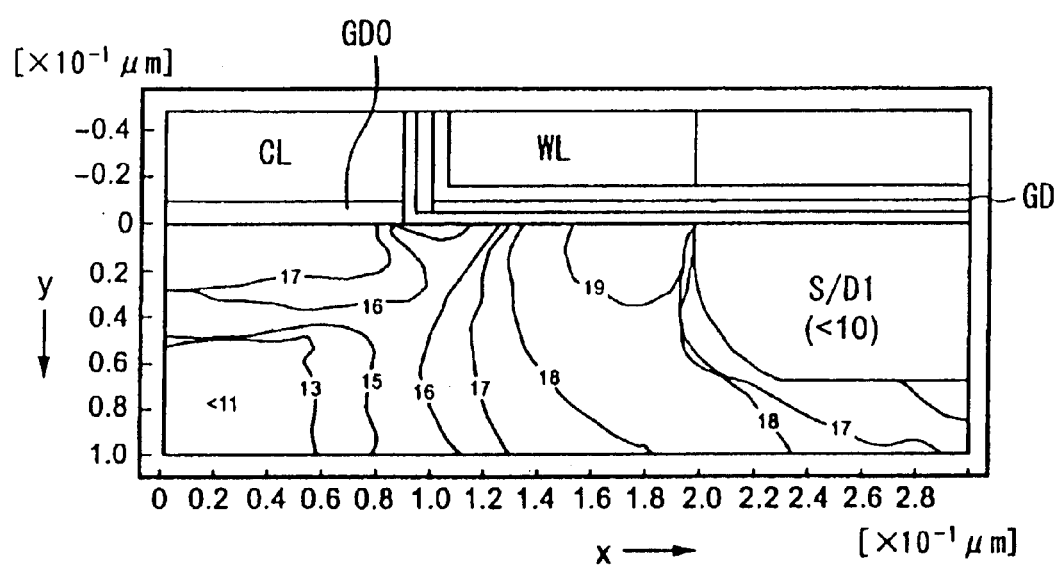
FIG. 18 is a view of a high-energy charge distribution obtained from results of performing the same simulation to an element structure without an accumulation layer-forming region as an object for comparison.

FIG. 18 is a view showing a case of a high-energy charge distribution of an element under the same bias conditions as the example illustrated in FIG. 17 without the provision of the accumulation layer-forming regions ACLa.

From comparing the illustrations of FIG. 17 and FIG. 18, it was learned that by providing the accumulation layer-forming region ACLa, the probability of generating high energy charges is about $10^9$ to $10^{10}$ higher. Further, in the case of FIG. 18, though a distribution center of comparatively high energy charges is a substrate surface side adjacent to the source/drain region S/D1 serving as the drain, in the case of FIG. 16 where the accumulation layer-forming region ACLa is provided, the distribution center thereof ranges from the entire region of the accumulation layer-forming region ACLa to a deep portion of the substrate down below. This indicates that the ionization colliding not only occurs in the accumulation layer-forming region ACLa, but also in the depletion layer below the accumulation layer-forming region ACLa. Thus, this supports the prediction that a good amount of high energy charges are generated.

Figure 19:
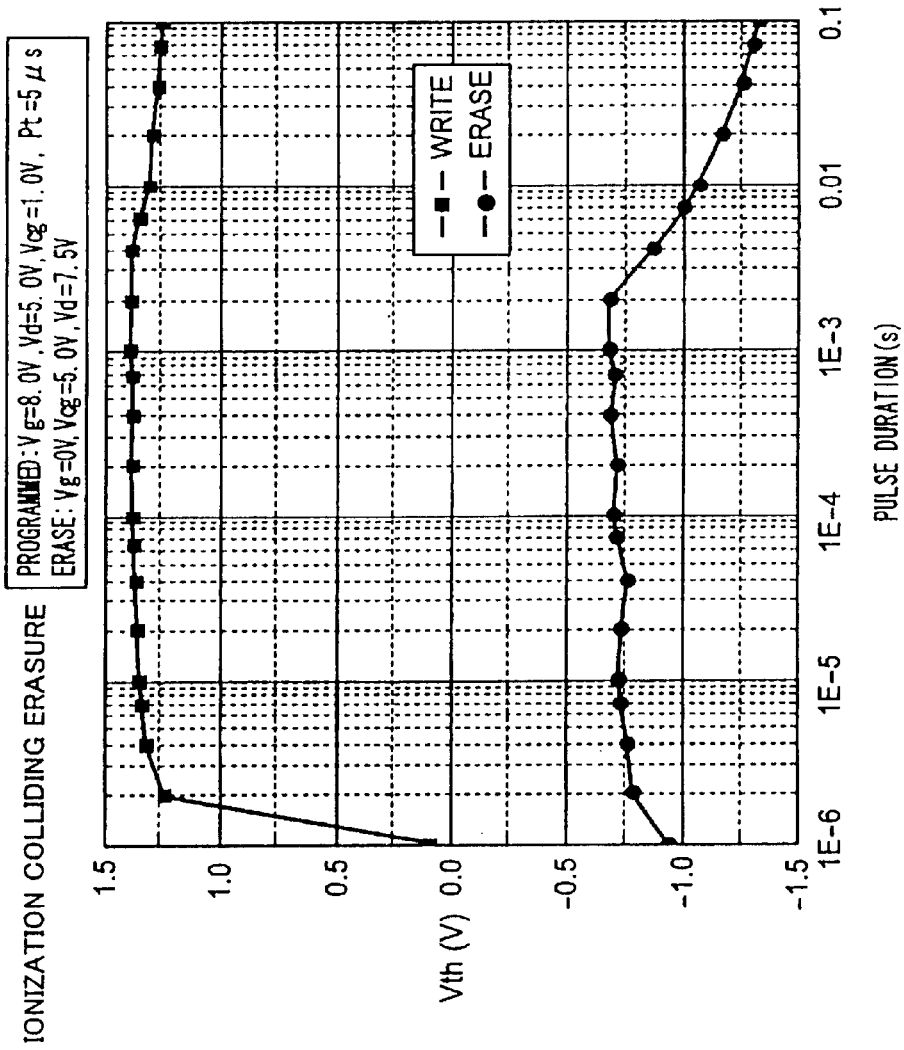
FIG. 19 is a graph showing data erasure characteristics of an operation of the memory cell of the second embodiment.

Based on such simulation results, the impurity concentration and depth of the accumulation layer-forming region ACL were determined to produce a prototype element. Thereafter, a threshold voltage variation was measured by injecting electrons of a quantity enabling obtainment of a predetermined threshold voltage variation into the storage 1 of the charge accumulation film GD of the element by the CHE injection, and injecting hot holes generated by the ionization colliding into the charge accumulation film GD while diversely changing a pulse duration for applying a drain voltage, that is, the so-called inversion read method. The result of this measurement is shown in FIG. 19.

In this measurement, a measurement of a writing side at a threshold measurement after the first pulse application could not be measured, however, a threshold voltage variation of 2 V or more from an erasure state was already achieved in a short time erasure of 2 µs. Thus it became clear that extremely high-speed erasure is possible if the ionization colliding is utilized.

Figure 20:
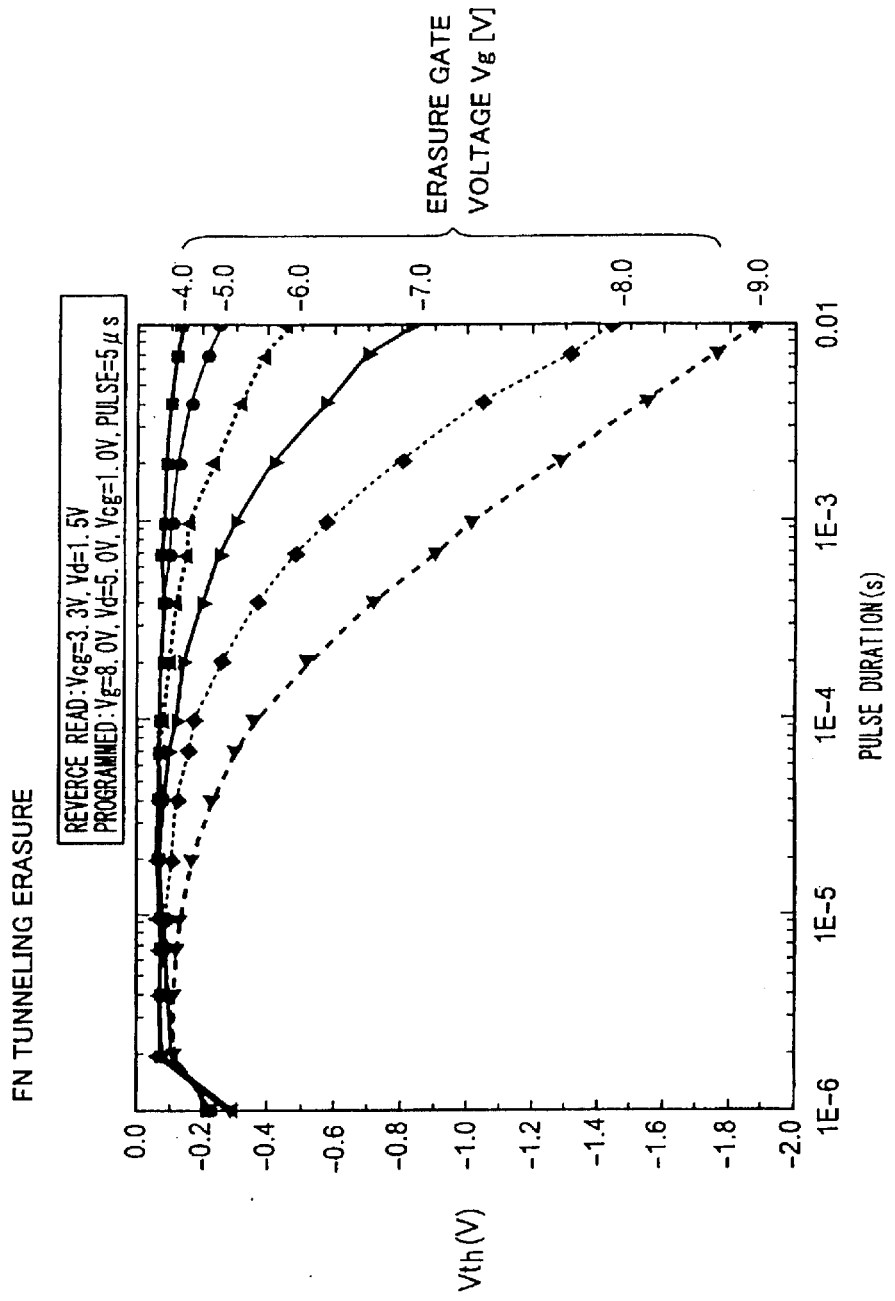
FIG. 20 is a graph showing data erasure characteristics utilizing a conventional type FN tunneling.

As a reference, a conventional FN tunneling erasure characteristic is shown in FIG. 20. The sample (non-volatile memory device) used in this measurement has a split gate structure, however, it does not have a low concentrated impurity region (accumulation layer-forming region ACLa) as the present embodiment. At the time of erasing, close to −10 V of negative voltage is applied to the memory gate to extract the accumulated charges to the substrate side by FN tunneling. Or, under a state where a predetermined voltage is applied to the control gate, a negative bias is applied to the memory gate. These erasure methods are the same as the first embodiment, and therefore details thereof will be omitted here.

In the measurement of the erasure characteristic of FIG. 20, the above FN tunneling erasure was used. Further, a pulse application duration dependency of a threshold voltage was examined by changing the impress voltage of the memory gate from −4.0 V to −9.0 V. In the FN tunneling erasure, almost all the threshold voltages do not vary in the short time erasure of 2 µs. If trying to obtain a threshold voltage variation of 2 V or more, 10 ms or greater is required even if the impress voltage of the gate is a high voltage of −9 V, and therefore the erasure operation is extremely slower than the erasure time of 2 µs by the ionization colliding erasure of the present embodiment.

In the present embodiment, also with the aim to examine a relationship between the depth of the accumulation layer-forming region ACLa and the generation probability of high energy charges at the time of test production, the energy at the time of ion injection was diversely changed. The relationship between the ion injection energy and erasure characteristics is shown in FIG. 20. Shown in FIG. 21 are samples of a drain voltage dependency of threshold voltages 7 keV, 15 keV, and 25 keV as the energy of ion injection. Among these, the ion injection energy of 15 keV is fastest for erasure of an element, slowing down at 25 keV and 7 keV in that order. Namely, there is an optimal value for the depth of the accumulation layer-forming region ACLa, that is, it is not good if too shallow or too deep. If the accumulation layer-forming region is too shallow, the high energized electrons will be injected, thereby inhibiting the reduction of the threshold voltage. Contrarily, if too deep, the generation probability of hot electrons is reduced or it indicates that the injection of holes is not progressing efficiently due to the fact that the source of generating hot electrons is too far from the substrate surface.

In the mode 1-2 of FIG. 16, ionization colliding erasure is performed under a state where the substrate is not applied with a voltage by the substrate voltage controlling means 3 but is in an open state (floating state). At this point, the other bias conditions are set the same as those of the above mode 1-1. In the ionization colliding erasure, a considerable amount of hot holes are generated in one time and a large portion thereof flows to the substrate. Therefore, to reduce the current load of peripheral circuits by suppressing a substrate current, it is preferable that the substrate is electrically rendered into a floating state as such. Further, if the substrate is rendered into an open state, only the electric field between the drain and memory gate generates holes. Therefore, the generated hot holes are efficiently injected into the charge trap film CHS. In this case, if the substrate or well potential varies at all, fluctuation may possibly occur in the erasure speed. However, since the erasure speed is an extremely short time, influences thereto are thought to be small, and therefore it is possible to sufficiently erase all the object cells by optimizing the erasure speed.

Different from the other modes 1-1 and 1-2 explained above, the mode 1-2 utilizes hot holes generated due to the inter-band tunnel current. In this erasure method, though described in detail in the first embodiment, only a reference potential and a positive voltage is used here whereas a negative voltage is not used. In other words, 8 to 9 V of the positive voltage Vd is applied to the drain under a state where the source is rendered open and the substrate potential Vsub, the application voltages Vmg and Vcg of the memory gate and the control gate are all held at a reference potential. Due to an electric field between the drain and the memory gate, a deep depletion layer is formed on the surface of the source/drain region S/D1 functioning as a drain and the accumulation layer-forming region ACLa whereby an inter-band tunneling current is generated due to a precipitous bending of the energy band. A pair of hot electron and hot hole is generated due to this, and between the two, the hot hole is injected into the charge trap film CHS of the charge accumulation film GD.

The electric field generating hot holes caused by such inter-band tunneling or ionization colliding is lower compared with the electric field necessary for simply extracting the electrons from inside the entire surface of the channel using the FN tunneling. Further, since a negative voltage is not used, the peripheral circuits can be simplified, and is suitable for a non-volatile memory in which affinity of the process thereof with logic circuits intermixedly installed in a system LSI or the like is demanded.

Various modifications may be made to the first to third embodiments of the present invention.

The structure of the charge accumulation film GD is not limited to the so-called MONOS type EEPROM, but may be the MNOS type EEPROM. Further, the present invention is applicable to small size conductors, for example, nanocrystal types having particles of polycrystalline silicon dispersed and embedded inside the dielectric film, or further the so-called FG type EEPROM.

In the memory cell M illustrated in FIG. 2A, the memory cell M' illustrated in FIG. 11A, the memory cell M2 illustrated in FIG. 13A, and the memory cell 2' illustrated in FIG. 14A, the gate electrode may be formed singularly. The present invention has an accumulation layer-forming region, and controlling the concentration and depth thereof enables the gate impress voltages of the memory transistor and the control transistor to be made equivalent. In this case, an advantage of simplifying the element structure can be obtained.

According to the non-volatile semiconductor memory circuit of the present invention, since the non-volatile semiconductor memory circuit comprises a channel structure capable of easily generating a high electric field required in the source side injection, the source side injection efficiency is improved. Due to this, a writing or erasing time is shortened. Or, it became possible to reduce an impress voltage and consumption power necessary for writing or erasing.

According to the operation of the non-volatile semiconductor memory circuit of the present invention, a high electric field required in the source side injection is easily generated, and since the charge injection efficiency is high by a charge injection operation using the high electric field, high-speed and low consumption power data storage can be performed. At the time of the above charge injection and when injecting charges having a reverse polarity, utilizing the ionization colliding or inter-band tunneling current enables high energy electrons to be generated without using a negative voltage. Therefore, peripheral circuits can be simplified. Due to this, a data system integrated with other logic circuits, etc. can utilize the present invention.

INDUSTRIAL APPLICABILITY

The non-volatile memory device of the present invention can be used as a memory of a variety of electronic devices.

What is claimed is:

1. A non-volatile semiconductor memory device comprising:

a first conductivity type semiconductor substrate (SUB);

a first conductivity type inversion layer-forming region (CH1) defined in a surface region of said semiconductor substrate (SUB), a channel being formed by an inversion layer therein;

second conductivity type accumulation layer-forming regions (ACLa, ACL2b) formed at least at one side of said inversion layer-forming region (CH1) in the surface region of said semiconductor substrate (SUB), channels being formed by accumulation layers therein;

a channel-forming region (CH) including said inversion layer-forming region (CH1) and said accumulation layer-forming regions (ACLa, ACLb);

a first second conductivity type region (S/D1) formed at one side of said channel forming region (CH) in the surface region of said semiconductor substrate (SUB);

a second second conductivity type region (S/D2) formed at other side of said channel forming region (CH) in the surface region of said semiconductor substrate (SUB);

an insulating film (GD0) formed on said inversion layer-forming region (CH1);

a first conductive layer (CL) formed on said insulating film (GD0);

a charge accumulation film (GD) having a charge accumulation faculty formed on an upper surface of said first conductive layer (CL), a side surface of a stacked portion of said insulating film (GD0) and said first conductive layer (CL), an exposure surface of said inversion layer-forming region (CH1), an upper surface of said accumulation layer-forming regions (ACLa, ACLb), and an upper surface of said first and second second conductivity type regions (S/D1, S/D2); and a second conductive layer (WL) formed on said charge accumulation film (GD), said second conductive layer (WL) being connected to a word line, and said first and second second conductivity type regions (S/D1, S/D2) being connected to bit lines (Bla, BLb).

2. A non-volatile semiconductor memory device as set forth in claim 1, wherein an impurity concentration of said accumulation layer-forming regions (ACLa, ACLb) is lower than an impurity concentration of said first and second second conductivity type regions (S/D1, S/D2).

3. A non-volatile semiconductor memory device as set forth in claim 1, wherein:
   two of said accumulation layer-forming regions (ACLa, ACLb) are formed at both sides of said inversion layer-forming region (CH1);
   a control transistor (CT) is formed by said inversion layer-forming region (CH1), said two accumulation layer-forming regions (ACLa, ACLb), said insulating film (GD0), and said first conductive layer (CL);
   a first memory transistor (MT1) is formed by one of said two accumulation layer-forming regions (ACLa), said inversion layer-forming region (CH1), said first second conductivity type region (S/D1), said charge accumulation film (GD), and said second conductive layer (WL); and
   a second memory transistor (MT2) is formed by the other of said two accumulation layer-forming regions (ACLb), said inversion layer-forming region (CH1), said second second conductivity type region (S/D2), said charge accumulation film (GD), and said second conductive layer (WL).

4. A non-volatile semiconductor memory device as set forth in claim 1, wherein:
   one of said accumulation layer-forming region (ACLa) is formed between said inversion layer-forming region (CH1) and said first second conductivity type region (S/D1);
   a control transistor (CT) is formed by said inversion layer-forming region (CH1), said accumulation layer-forming region (ACLa), said first second conductivity type region (S/D1), said insulating film (GD0), and said first conductive layer (CL); and
   a memory transistor (MT1) is formed by said accumulation layer-forming region (ACLa), said inversion layer-forming region (CH1), said first second conductivity type region (S/D1), said charge accumulation film (GD), and said second conductive layer (WL).

5. A non-volatile semiconductor memory device as set forth in claim 1, wherein
   said charge accumulation film (GD, BTM, CHS, TOP) is formed by stacking the following:
   a first potential barrier film (BTM) formed covering an upper surface of said first conductive layer (CL), a side surface of a stacked portion of said insulating film (GD0) and said first conductive layer, an exposure surface of said inversion layer-forming region (CH1), an upper surface of said accumulation layer-forming regions (ACLa, ACLb), and upper surfaces of said first and second second conductivity type regions (S/D1, S/D2);
   a charge trap film (CHS) formed on said first potential barrier film (BTM), and
   a second potential barrier film (TOP) formed on said charge trap film CHS for imparting a deep charge capturing level in the vicinity of an interface with said charge trap film.

6. A non-volatile semiconductor memory device as set forth in claim 1, wherein a thickness of said second potential barrier film (TOP) is defined as a thickness for preventing injection of a hole from said second conductive layer (WL).

7. A non-volatile semiconductor memory device as set forth in claim 1, wherein a width of said first conductive layer (CL) has a length wherein a carrier supplied from one of said second conductivity type region (S/D2) travels ballistically or semi-ballistically in said inversion layer-forming region (CH1).

8. A non-volatile semiconductor memory device as set forth in claim 1, further comprising an operation controlling means,
   said operation controlling means performs the following operation at the time of writing or erasing data:
   applying a drain voltage to one of said first and second second conductivity type region (S/D1) and a reference voltage to the other (S/D2) thereof, and
   applying a first gate voltage to said second conductive layer (WL) and a second gate voltage lower than said first gate voltage to said second conductive layer (CL) so that a charge energetically excited in said inversion layer-forming region (CH1) near an interface with said accumulation layer-forming region (ACLa) is injected into said charge accumulation film (GD) under said second conductive layer (WL) from the other said second conductively type region (S/D2) applied with said reference voltage at the time of writing or erasing data.

9. A non-volatile semiconductor memory device as set forth in claim 1, further comprising an operation controlling means,
   said operation controlling means performs the following operation at the time of writing or erasing data:
   applying a drain voltage to one of said first and second second conductivity type region (S/D1) and a reference voltage to the other (S/D2) thereof; and
   applying an optimized voltage to said first conductive layer (CL) and said second conductive layer (WL), respectively, so that a carrier supplied to said inversion layer-forming region (CH1) traveling in a formed inversion layer is accelerated, and the accelerated high energy carrier is caused to collide with a semiconductor lattice at said accumulation layer-forming region (ACLa) side to thereby generate a pair of electron and electron hole by ionization at the time of collision, whereby the generated electron hole is injected into said charge accumulation film (GD) below said second conductive layer (W).

10. A non-volatile semiconductor memory device as set forth in claim 1, further comprising an operation controlling means,
    said operation controlling means performs the following operation, at the time of writing or erasing data:
    applying a reference voltage to said first and second conductive layers (CL, WL) and said semiconductor substrate (SUB);
    rendering one of said first and second second conductivity type regions (S/D2) into an electrically floating state and forming a depletion layer in the other said second conductivity type region (S/D1);
    generating a pair of electron and electron hole by interband tunneling in the formed depletion layer; and
    having the generated electron hole apply a value of a positive voltage injected into said charge accumulation film (GD) to the other of said first and second second conductivity type regions (S/D1).

11. A non-volatile semiconductor memory device comprising:
    a first conductivity type semiconductor substrate (SUB);
    a first conductivity type inversion layer-forming region (CH1) defined in a surface region of said semiconductor substrate (SUB), channels being formed by an inversion layer therein;

second conductivity type accumulation layer-forming regions (ACLa, ACL2b) formed at least at one side of said inversion layer-forming region (CH1) in a surface region of said semiconductor substrate (SUB), channels being formed by accumulation layers therein;

a channel forming region (CH) including said inversion layer-forming region (CH1) and said accumulation layer-forming regions (ACLa, ACLb);

a first second conductivity type region (S/D1) formed at one side of said channel forming region (CH) in the surface region of said semiconductor substrate (SUB);

a second second conductivity type region (S/D2) formed at other side of said channel forming region (CH) in the surface region of said semiconductor substrate (SUB);

an insulating film (GD0) formed on said inversion layer-forming region (CH1);

a first conductive layer (WG) formed on said insulating film (GD0);

a charge accumulation film (GD) having a charge accumulation faculty formed on a side surface of a stacked portion of said first conductive layer (WG) and said insulating film (GD0), an exposure surface of said inversion layer-forming region (CH1), an upper surface of said accumulation layer-forming regions (ACLa, ACLb), and an upper surface of said first and second second conductivity type regions (S/D1, S/D2); and second conductive layers (CLa, CLb) formed on said charge accumulation film (GD) at a location above said accumulation layer-forming regions (ACLa, ACLb), said first conductive layer (WG) being connected to a word line, and said first and second second conductivity type regions (S/D1, S/D2) being connected to bit lines (Bla, BLb).

12. A non-volatile semiconductor memory device as set forth in claim 11, wherein an impurity concentration of said accumulation layer-forming regions (ACLa, ACLb) is lower than an impurity concentration of said first and second second conductivity type regions (S/D1, S/D2).

13. A non-volatile semiconductor memory device as set forth in claim 11, wherein:

two of said accumulation layer-forming regions (ACLa, ACLb) are formed at both sides of said inversion layer-forming region (CH1);

a control transistor (CT) is formed by said inversion layer-forming region (CH1), said two accumulation layer-forming regions (ACLa, ACLb), said insulating film (GD0), and said first conductive layer (WG);

a first memory transistor (MT1) is formed by one of said two accumulation layer-forming regions (ACLa), said inversion layer-forming region (CH1), said first second conductivity type region (S/D1), said charge accumulation film (GD), and said second conductive layer (CLa); and a second memory transistor (MT2) is formed by the other of said two accumulation layer-forming regions (ACLb), said inversion layer-forming region (CH1), said second second conductivity type region (S/D2), said charge accumulation film (GD), and said second conductive layer (CLb).

14. A non-volatile semiconductor memory device as set forth in claim 11, wherein:

one of said accumulation layer-forming region (ACLa) is formed between said inversion layer-forming region (CH1) and said first second conductivity type region (S/D1);

a control transistor (CT) is formed by said inversion layer-forming region (CH1), said accumulation layer-forming region (ACLa), said first second conductivity type region (S/D1), said insulating film (GD0), and said first conductive layer (WG); and a memory transistor (MT1) is formed by said accumulation layer-forming region (ACLa), said inversion layer-forming region (CH1), said first second conductivity type region (S/D1), said charge accumulation film (GD), and said second conductive layer (CLa).

15. A non-volatile semiconductor memory device as set forth in claim 11, wherein said charge accumulation film (GD, BTM, CHS, TOP) is formed by stacking the following:

a first potential barrier film (BTM) formed on a side surface of a stacked portion of said first conductive layer (WG) and said insulating film (GD0), an exposure surface of said inversion layer-forming region (CH1), an upper surface of said accumulation layer-forming regions (ACLa, ACLb), and an upper surface of said first and second second conductivity type regions (S/D1, S/D2);

a charge trap film (CHS) formed on said first potential barrier film (BTM), and a second potential barrier film (TOP) formed on said charge trap film CHS for imparting a deep charge capturing level in the vicinity of an interface with said charge trap film.

16. A non-volatile semiconductor memory device as set forth in claim 11, wherein a thickness of said second potential barrier film (TOP) is defined as a thickness for preventing injection of a hole from said second conductive layer (WL).

17. A non-volatile semiconductor memory device as set forth in claim 11, wherein a width of said first conductive layer (WG) has a length wherein a carrier supplied from one of said second conductivity type region (S/D2) travels ballistically or semi-ballistically inside said inversion layer-forming region (CH1).

18. A non-volatile semiconductor memory device as set forth in claim 11, further comprising an operation controlling means, said operation controlling means performs the following operation, at the time of writing or erasing data:

applying a drain voltage to one of said first and second second conductivity type regions (S/D1) and a reference voltage to the other (S/D2) thereof, and applying a first gate voltage to said second conductive layer (CLa) and a second gate voltage lower than said first gate voltage to said second conductive layer (WG) so that a charge energetically excited in said inversion layer-forming region (CH1) near an interface with said accumulation layer-forming region (ACLa) is injected into said charge accumulation film (GD) under said second conductive layer (CLa) from the other said second conductively type region (S/D2) applied with said reference voltage.

19. A non-volatile semiconductor memory device as set forth in claim 11, further comprising an operation controlling means, said operation controlling means performs the following operation, at the time of writing or erasing data:

applying a drain voltage to one of said first and second second conductivity type region (S/D1) and a reference voltage to the other (S/D2) thereof, and applying an optimized voltage to said first conductive layer (CL) and said second conductive layer (WL), respectively, so that a carrier supplied to said inversion layer-forming region (CH1) traveling in a formed inversion layer is accelerated, and the accelerated high energy carrier is caused to collide with a semiconductor lattice at said accumulation layer-forming region (ACLa) side to thereby generate a pair of electron and electron hole by ionization at the time of collision, whereby the generated electron hole is injected into said charge accumulation film (GD) below said second conductive layer (WL).

20. A non-volatile semiconductor memory device as set forth in claim 1, further comprising an operation controlling means, said operation controlling means performs the following operation at the time of writing or erasing data:

applying a reference voltage to said first and second conductive layers (MG, CLa, CLb) and said semiconductor substrate (SUB);

rendering one of said first and second second conductivity type regions (S/D2) to an electrically floating state and forming a depletion layer in the other said second conductivity type region (S/D1);

generating a pair of electron and electron hole by inter-band tunneling in the formed depletion layer; and having the generated electron hole apply a value of a positive voltage injected into said charge accumulation film (GD) to the other of said first and second second conductivity type regions (S/D1).

* * * * *

UNITED STATES PATENT AND TRADEMARK OFFICE
CERTIFICATE OF CORRECTION

PATENT NO. : 6,911,691 B2
DATED : June 28, 2005
INVENTOR(S) : Hideto Tomiie et al.

It is certified that error appears in the above-identified patent and that said Letters Patent is hereby corrected as shown below:

Title page,
Insert Item,
-- [30] Foreign Application Priority Data
June 1, 2001        (JP)    2001-166835
November 16, 2001   (JP)    2001-351417 --.

Signed and Sealed this

Twenty-third Day of August, 2005

JON W. DUDAS
*Director of the United States Patent and Trademark Office*